United States Patent
Mountsier et al.

(10) Patent No.: US 8,053,861 B2
(45) Date of Patent: Nov. 8, 2011

(54) DIFFUSION BARRIER LAYERS

(75) Inventors: Thomas W. Mountsier, San Jose, CA (US); Roey Shaviv, Palo Alto, CA (US); Steven T. Mayer, Lake Oswego, OR (US); Ronald A. Powell, Portola Valley, CA (US)

(73) Assignee: Novellus Systems, Inc., San Jose, CA (US)

( * ) Notice: Subject to any disclaimer, the term of this patent is extended or adjusted under 35 U.S.C. 154(b) by 216 days.

(21) Appl. No.: 12/359,997

(22) Filed: Jan. 26, 2009

(65) Prior Publication Data
US 2010/0187693 A1    Jul. 29, 2010

(51) Int. Cl.
*H01L 21/70* (2006.01)
(52) U.S. Cl. ........ 257/510; 257/643; 257/751; 257/758; 257/759; 438/618; 438/619
(58) Field of Classification Search .......... 438/627, 438/680, 687, 618, 619, 624, 781, 725, 623; 257/751, 510, 643, 758, 759, E23.019, E21.295
See application file for complete search history.

(56) References Cited

U.S. PATENT DOCUMENTS

| | | | | |
|---|---|---|---|---|
| 5,661,344 A * | 8/1997 | Havemann et al. | ........... | 257/758 |
| 6,015,749 A * | 1/2000 | Liu et al. | ........... | 438/628 |
| 6,071,809 A * | 6/2000 | Zhao | ........... | 438/634 |
| 6,093,966 A * | 7/2000 | Venkatraman et al. | ........ | 257/751 |
| 6,284,657 B1 * | 9/2001 | Chooi et al. | ........... | 438/687 |
| 6,399,496 B1 | 6/2002 | Edelstein et al. | | |
| 6,525,829 B1 * | 2/2003 | Powell et al. | ........... | 356/630 |
| 6,566,262 B1 * | 5/2003 | Rissman et al. | ........... | 438/687 |
| 6,642,146 B1 * | 11/2003 | Rozbicki et al. | ........... | 438/687 |
| 6,723,635 B1 * | 4/2004 | Ngo et al. | ........... | 438/627 |
| 6,764,940 B1 * | 7/2004 | Rozbicki et al. | ........... | 438/627 |
| 6,812,143 B2 * | 11/2004 | Lane et al. | ........... | 438/643 |
| 6,831,366 B2 * | 12/2004 | Gates et al. | ........... | 257/760 |
| 7,084,062 B1 | 8/2006 | Avanzino et al. | | |
| 7,189,336 B2 * | 3/2007 | Morikawa et al. | ........... | 216/106 |
| 7,229,923 B2 * | 6/2007 | Catabay et al. | ........... | 438/687 |
| 7,309,659 B1 * | 12/2007 | Subramanian et al. | ........ | 438/763 |
| 7,466,027 B2 * | 12/2008 | Ko et al. | ........... | 257/774 |
| 7,573,133 B2 * | 8/2009 | Cohen | ........... | 257/758 |
| 7,651,934 B2 * | 1/2010 | Lubomirsky et al. | ........ | 438/584 |
| 7,675,177 B1 * | 3/2010 | Lu et al. | ........... | 257/774 |
| 7,682,966 B1 * | 3/2010 | Rozbicki et al. | ........... | 438/637 |
| 7,723,226 B2 * | 5/2010 | Yu et al. | ........... | 438/618 |

(Continued)

OTHER PUBLICATIONS

Bjerkelund, E., et al., "On the crystal structure of TaTe4", Journal of the Less Common Metals, vol. 7, Issue 3, Sep. 1964, pp. 231-234.

(Continued)

*Primary Examiner* — N Drew Richards
*Assistant Examiner* — Ankush Singal
(74) *Attorney, Agent, or Firm* — Weaver Austin Villeneuve & Sampson LLP

(57) ABSTRACT

Provided are methods and apparatuses for depositing barrier layers for blocking diffusion of conductive materials from conductive lines into dielectric materials in integrated circuits. The barrier layer may contain copper. In some embodiments, the layers have conductivity sufficient for direct electroplating of conductive materials without needing intermediate seed layers. Such barrier layers may be used with circuits lines that are less than 65 nm wide and, in certain embodiments, less than 40 nm wide. The barrier layer may be passivated to form easily removable layers including sulfides, selenides, and/or tellurides of the materials in the layer.

24 Claims, 8 Drawing Sheets

U.S. PATENT DOCUMENTS

| | | | |
|---|---|---|---|
| 7,781,327 B1* | 8/2010 | Kailasam et al. ............ | 438/622 |
| 7,964,504 B1* | 6/2011 | Shaviv et al. ............... | 438/680 |
| 2003/0059980 A1* | 3/2003 | Chen et al. ................. | 438/118 |
| 2003/0124840 A1* | 7/2003 | Dubin ........................ | 438/643 |
| 2003/0203617 A1* | 10/2003 | Lane et al. ................. | 438/627 |
| 2003/0228753 A1* | 12/2003 | Hau-Riege et al. .......... | 438/639 |
| 2004/0046835 A1* | 3/2004 | Yang et al. ................. | 347/50 |
| 2004/0137153 A1* | 7/2004 | Thomas et al. ............. | 427/384 |
| 2004/0137714 A1* | 7/2004 | Friedemann et al. ........ | 438/627 |
| 2004/0157425 A1* | 8/2004 | Catabay et al. ............. | 438/597 |
| 2004/0227247 A1* | 11/2004 | Chooi et al. ................ | 257/758 |
| 2004/0238961 A1 | 12/2004 | Cunningham | |
| 2006/0199386 A1* | 9/2006 | Huang et al. ............... | 438/687 |
| 2006/0249849 A1 | 11/2006 | Cohen | |
| 2006/0258150 A1* | 11/2006 | Raaijmakers et al. ....... | 438/627 |
| 2007/0023870 A1* | 2/2007 | Dubois et al. .............. | 257/642 |
| 2007/0123043 A1* | 5/2007 | Streck et al. ............... | 438/687 |
| 2007/0178692 A1* | 8/2007 | Catabay et al. ............. | 438/638 |
| 2007/0218670 A1* | 9/2007 | Ishizaka ...................... | 438/597 |
| 2007/0281497 A1* | 12/2007 | Liu et al. .................... | 438/781 |
| 2008/0050919 A1* | 2/2008 | Van Aelst et al. ........... | 438/702 |
| 2008/0284036 A1* | 11/2008 | Murray et al. .............. | 257/773 |
| 2009/0053888 A1* | 2/2009 | Ding et al. .................. | 438/627 |
| 2009/0273085 A1* | 11/2009 | Jourdan et al. .............. | 257/751 |
| 2009/0280598 A1* | 11/2009 | Curtis et al. ................ | 438/102 |
| 2009/0283740 A1* | 11/2009 | Kozicki et al. .............. | 257/4 |

OTHER PUBLICATIONS

Braeckelmann, G., et al, "Integration and Reliability of Copper Magnesium Alloys for Multilevel Interconnects", 2000 IEEE conference held Jun. 5-7, 2000, pp. 236-238.

Ding, P.J., et al., "Oxidation resistant high conductivity copper films," Appl. Phys. Lett. 64 (21), May 23, 1994, pp. 2897-2899.

Fjellvag, H., et al., "Pressure induced phase transition in $MnTe_2$ studied by synchrotron radiation-comparison with $RuTe_2$", Journal of Magnetism and Magnetic Materials, Mar. 1995, vol. 145, No. 1-2, pp. 118-124.

Fjellvag, H., et al., "Structural properties of $ZrTe_5$ and $HfTe_5$ as seen by powder diffraction", Solid State Communications, Oct. 1986, vol. 60, No. 2, pp. 91-93.

Iijima, J., et al., "Growth Behavior of Self-Formed Barrier Using Cu-Mn Alloys at 350 to 600° C.", IITC 2006, proceedings of a meeting held Jun. 5-7, 2006, pp. 155-157.

Nouvel, G., et al., "Effect of metal substitution in $ZrSe_3$-type compounds: Vibrational states of $Zr_{1-t}Hf_tS_3$", Physical Review B (Condensed Matter) Jul. 15, 1985, vol. 32, No. 2, pp. 1165-1171.

Pathen, H.M., et al, "Preparation and characterization of copper telluride thin films by modified chemical bath deposition method", App. Surf. Sci., vol. 218, Sep. 30, 2003, pp. 291-297.

Shaviv, Roey, et al., "Zirconium telluride ($ZrTe_5$) and hafnium telluride ($HfTe_5$): the heat capacity and derived thermophysical properties from 6 to 350 K", Journal of Solid State Chemistry 81, Mar. 3, 1989, pp. 103-111.

Zwick, A., et al., "Raman scattering in the IVB transition-metal trichalcogenides: $ZrS_3$, $ZrSe_3$, $ZrTe_3$ and $HfSe_3$", Journal of Physics C (Solid State Physics) Oct. 30, 1980, vol. 13, No. 30, pp. 5603-5614.

WO patent application No. PCT/US2010/021857, International Search Report and Written Opinion mailed Aug. 20, 2010.

* cited by examiner

DIFFUSION BARRIER LAYERS

FIELD OF THE INVENTION

The present invention relates generally to methods and an apparatus for fabricating integrated circuits and more particularly to methods and an apparatus for depositing a diffusion barrier for blocking diffusion of conductive metals from circuit lines into dielectric materials in integrated circuits.

BACKGROUND OF THE INVENTION

Integrated circuit (IC) fabrication methods generally involve deposition of conductive metals into recessed features and other surfaces forming a layer of inter-layer dielectric (ILD). The deposited metal provides the conductive paths, which extend horizontally and vertically within the IC substrate, connecting the active devices (e.g., transistors) in a desired pattern. The metal lines formed in adjacent ILD layers are connected to each other by a series of interconnections (interconnects). On a typical wafer substrate, one or several dielectric layers are deposited onto a layer containing the active devices and are patterned to provide vertical and horizontal recessed features (vias and trenches), which are subsequently filled with conductive metals. The resulting layer containing metal-filled lines residing in a dielectric is referred to as a metallization layer. Copper is a commonly used metal in modern devices due to its low resistivity and high electromigration resistance. Aluminum is another frequently used metallization metal.

Some conductive metals, for example copper, can diffuse into the dielectric material that forms the trench or provides a surface and can impact dielectric properties. Maintaining low dielectric constants (low-k) is particularly important in ICs having densely packed features, where the insulating dielectric is thin and can lead to excessive capacitance. This can cause signal delay (RC time constant) and crosstalk between conducting lines, thus adversely affecting the performance of the device. A barrier is typically used to prevent conductive metals, particularly Cu, from diffusing into the dielectric. The diffusion barrier is a continuous layer deposited between the dielectric and the conducting metal and is usually sufficiently thick and made of materials that prevent migration of conductive metals from the line and via region. Many barrier materials are poor electronic conductors in comparison to copper and aluminum and also are resistive to initiating uniform and adherent electroplating thereupon. Hence these barriers typically require an additional conductive seed layer suitable to initiate and promote feature filling and electroplating of the conductive metal over the diffusion barrier layer. However, each such layer adds to production costs and complicates reducing the size of device nodes.

Further miniaturization of IC devices results in constantly decreasing dimensions of device features. Conductive line widths are already below 200 nm in many ICs, and it is expected that 40 nm lines will soon be commercially feasible. Electroplating copper or other material into such small features can present a set of challenges. Specifically, the diffusion barrier and conductive seed layers must be scaled down together with the line's dimensions. However, reducing thicknesses of these layers may lead to undesirable results. For example, barrier strength and conductance are directly dependent on the thicknesses of the corresponding layers. It may be desirable to eliminate one layer, such as a conductive seed layer, and electroplate directly onto a diffusion barrier layer that is sufficiently conductive. Moreover, many diffusion barrier materials do not adhere well to underlining dielectrics leading to poor Time Dependent Dielectric Breakdown (TDDB) behavior and Electromigration (EM) performance, both of which can cause premature failure of the IC, particularly in smaller circuit lines.

Overall, there is a need for improved diffusion barriers suitable for use within small dense features. Such barriers should be thin while providing good resistance to diffusion, conductivity, electromigration resistance, and adhesion-to-dielectric characteristics.

SUMMARY

The present invention provides methods of depositing barrier layers for blocking diffusion of metals from IC lines into a surrounding dielectric material. The methods may be applied to a wide range of line sizes including advanced technology nodes such as 65 nm 45 nm, 32 nm, and beyond. The superior properties of layers described herein, such as resistance to diffusion, high conductivity, electromigration deterrence, and others, may be achieved by combining two or more materials in a single barrier layer. Materials strongly exhibiting one desirable property may be paired with other materials exhibiting different properties and capable of masking undesirable properties of the primary material.

Two or more different materials may be combined in a single diffusion barrier layer as a chemical compound, an alloy, or other chemical or metallurgical composition. In the case of an alloy, multiple components may be evenly distributed throughout a layer of barrier materials. Alternatively, the concentration of the component materials may vary throughout the thickness of the layer. Materials exhibiting stronger adhesion to dielectric and better resistance to diffusion may be concentrated on the dielectric interface, while materials with a lower resistance for initiating electrodeposition thereupon may be concentrated towards the electroplated metal interface. Graded distributions of the component materials may be created during the deposition process or during the subsequent annealing process.

In one embodiment, a method of depositing a copper-containing diffusion barrier layer includes receiving a partially fabricated IC and depositing a diffusion barrier layer on and in contact with the exposed surface of the dielectric material. Any number of deposition methods can be used including, for example, Physical Vapor Deposition (PVD), Atomic Layer Deposition (ALD), and Chemical Vapor Deposition (CVD). In one specific embodiment, the entire copper-containing diffusion barrier is deposited using a PVD process employing one PVD sputtering target. The target may be made of alloy or include one or more wedges or other shaped inserts of materials that are different than the main body of the target.

In certain embodiments, the diffusion barrier material includes copper, which is frequently the material that should be blocked from diffusion by the barrier. This counter-intuitive approach works only for certain types of copper-containing materials. Some of these will be described in this section and again, more fully, later in the application. In certain embodiments, the copper-containing diffusion barrier layer has an average thickness of no greater than about 15 nanometers. In one specific embodiment, the average thickness is between about 1 and 10 nanometers. The layer may be sufficiently conductive to allow uniform electroplating over its exposed surface without requiring an additional conductive layer (e.g., a seed layer). To this end, the diffusion barrier may have a sheet resistance of less than about 50 Ohm per square. In a specific embodiment, the conductivity of the layer may be between about 2 Ohm per square and 15 Ohm per square.

The copper-containing diffusion barrier layers may be particularly suited for applications in small technology nodes. In one embodiment, the copper-containing diffusion barrier layer is deposited on and in contact with an exposed surface of the recessed feature having a width of less than about 65 nanometers. In a more specific embodiment, such recessed feature has a width of less than about 40 nanometers. The layer may also be used for three-dimensional packaging interconnection through a dielectric material.

In one embodiment, the copper-containing diffusion barrier layer contains selenium and/or tellurium. The barrier layer may contain copper tellurides or selenides that are isoelectronic with copper oxides. In a specific embodiment, the copper-containing diffusion barrier layer includes copper tellurides and copper selenides, such as $Cu_2Te$, $Cu_2Se$, $CuTe$, and/or $CuSe$. Other stoichiometric variants of these materials may be used as well.

In some embodiments, the diffusion barrier layers may be deposited by immersing the exposed surface of a dielectric layer into a solution containing selenium ions and/or tellurium ions and also immersing the same surface into a solution including copper sulfate. Alternatively, the copper-containing diffusion barrier layer including selenium and/or tellurium may be deposited by sputtering copper on the exposed surface of the dielectric material using a PVD process and introducing selenium hydride and/or tellurium hydride into a PVD chamber during the sputtering. In a specific embodiment, the entire diffusion barrier is deposited using one PVD sputtering target, which may be made of the desired alloy or Cu with wedges or other shaped inserts of the alloying agent.

The copper-containing diffusion barrier layer may also include tantalum and one or more metals selected from the group IVB, VB, and VIB of the periodic table. In certain embodiments, the specific combination of barrier elements and copper concentration in the layer is such that copper is held within the layer and does not substantially diffuse into the dielectric material during fabrication and use of the integrated circuit. Additionally, the copper concentration may vary through the thickness of the layer. For example, the copper concentration at the dielectric interface may be such that it prevents copper in the bulk of the layer from diffusing into the dielectric. The copper concentration at the exposed surface, i.e. at the interface with the later deposited conductive line, may be at least about 75 atomic percent. In specific embodiments, the copper concentration at the exposed surface may be at last about 90 atomic percent. In some embodiments, the copper concentration at the dielectric interface may be less than about 20 atomic percent. The copper-containing diffusion barrier layer may also be annealed. Annealing may be performed under the following conditions: a temperature of about 150° C. and 400° C. for a length of between about 1 minutes and 120 minutes.

In one specific embodiment, the copper-containing diffusion barrier layer includes titanium. The concentration of copper in such layer may be between about 0.1 atomic percent and about 10 atomic percent. The remainder or at least the majority of the remainder is titanium. Alternatively, the copper-containing diffusion barrier layer may include hafnium and/or zirconium (in place of titanium) with the same range of copper concentrations. In a specific embodiment, the diffusion barrier includes titanium together with hafnium, and/or zirconium, as well as copper.

A PVD apparatus may be used for depositing a copper-containing diffusion barrier layer. In certain embodiments, such apparatus includes a process chamber configured to perform PVD, a PVD sputtering target including copper, a wafer support, and a controller containing program instructions for receiving the partially fabricated integrated circuit having the dielectric material with an exposed surface and depositing the copper-containing diffusion barrier on and in contact with the exposed surface of the dielectric material. In a specific embodiment, the PVD apparatus has only one PVD sputtering target. Such target may have a plurality of wedge or other shaped inlays, wherein at least two of the inlays have different compositions. For example some inlays may contain copper or a copper alloy and other inlays may contain titanium or a titanium alloy.

In one embodiment, an integrated circuit metallization layer is provided and contains a dielectric layer, a copper-containing diffusion barrier layer positioned on and in contact with the dielectric layer's surface, and a circuit line positioned on and in contact with the diffusion barrier layer. The copper-containing diffusion barrier may be prepared by, for example, using one of the deposition techniques and/or apparatus described above. The circuit line may include copper or any other conductive material, such as aluminum. In one specific embodiment, the barrier layer includes selenium and/or tellurium. Alternatively, the barrier layer may include tantalum and one or more other metals selected from the group IVB, VB, and VIB elements of the periodic table. Specifically, the diffusion barrier layer may include titanium, hafnium, and/or zirconium. The thickness of the barrier layer in the circuit may be, in certain embodiments, no greater than about 15 nm. Additionally, the copper concentration may vary throughout the layer. In embodiments employing graded concentrations of copper, the copper concentration at an interface with the dielectric layer is such that copper does not substantially diffuse into the dielectric layer.

An alternative embodiment provides a method of depositing a combined seed and diffusion barrier layer on a partially fabricated integrated circuit for blocking diffusion of copper to a dielectric material. In a specific embodiment, the method includes (a) receiving a partially fabricated IC, (b) depositing a metal layer on the exposed surface of the dielectric layer, and (c) converting an exposed metal surface of the metal layer to a layer of sulfide, selenide, and/or telluride of the metal to thereby protect the metal layer from forming an oxide. The metal layer may include a plurality of metals selected from the group IVB, VB, and VIB elements in the periodic table. In one specific embodiment, the metal layer includes tantalum. In an alternative embodiment, the metal layer includes titanium. In some cases, the metal layer may include zirconium and/or hafnium. Finally, the metal layer may also include copper.

In one embodiment, the method of depositing a combined seed layer and diffusion barrier layer may also include removing the sulfide, selenide, and/or telluride of the metal during electroplating and then electroplating a conductive metal to form a circuit line. The circuit line may be copper or any other suitable conductive material, such as aluminum.

The deposition process may involve a Physical Vapor Deposition (PVD), an Atomic Layer Deposition (ALD), or a Chemical Vapor Deposition (PVD) method or a combination thereof. In a specific embodiment, the entire combined seed layer and diffusion barrier layer is deposited using one PVD sputtering target, which may be made of alloy and/or include wedges or other shaped inlays. Likewise, converting the exposed metal surface of the metal layer to the layer of sulfide, selenide, and/or telluride of the metal may be performed using the same type of processes. The thickness of the combined seed and diffusion barrier layer may be no greater than about 15 nm, or between about 3 nm and 10 nm in a specific embodiment.

The layer of sulfide, selenide, and/or telluride of the metal may be sufficiently conductive to allow electroplating directly onto the layer of sulfide, selenide, and/or telluride of the metal without any additional conductive layers. In one embodiment, the sheet resistance of the layer may be no greater than about 50 Ohm per square. Alternatively, the sheet resistance of the layer may be no greater than about 20 Ohm per square.

A combined seed layer and diffusion barrier layer may be deposited in a recessed feature as narrow as about 65 nm or less. In certain embodiments, the recessed feature is less than about 40 nm wide. In other embodiments, the combined layer may be used for 3-D packaging interconnections.

In certain embodiments, the combined seed/barrier layer is deposited using a PVD apparatus that includes a PVD process chamber with a sputtering target, a wafer support, and a controller. The controller may include program instructions for receiving the partially fabricated IC into a defined location in a process chamber and then depositing a combined barrier layer. The instructions may also direct the formation of a passivation layer (e.g., a sulfide, selenide, and/or telluride of the materials) on the combined seed/barrier layer. In a specific embodiment, one PVD sputtering target may be used to deposit the combined seed/barrier layer, e.g. all materials forming the layer come from the same PVD sputtering target and/or precursor gases. In some embodiments, a PVD target has a plurality of wedge or other shaped inlays including materials that form the layer.

The combined seed and diffusion barrier layer may be a part of the overall integrated circuit metallization layer that also includes dielectric and circuit lines. The combined layer is positioned between and in contact with the dielectric and the circuit line. The layer prevents migration of conductive line materials, such as copper, into the dielectric. The layer may include one or more elements selected from groups IVB, VB, and VIB in the periodic table. More specifically, the layer may include tantalum, titanium, zirconium, and/or hafnium. To prevent oxidation of the layer when exposed to ambient conditions, the layer may also include a passivation layer of sulfides, selenides, and/or tellurides of the materials forming the layer. In certain embodiments, the thickness of the combined layer may be no greater than about 15 nm. Thinner layers are particularly beneficial for use with narrower conductive lines.

Another aspect of the invention pertains to a different type of multi-element diffusion barrier, and a method of depositing such diffusion barrier layer. In certain embodiments, the method involves depositing an alloy or a mixture of metals directly onto a dielectric. The alloy or the mixture may include titanium and tantalum or tantalum and aluminum. In another example, the alloy or the mixture includes titanium and/or tantalum and one or more of the following: ruthenium, cobalt, and nickel. In another example, manganese is combined with either titanium or tantalum or both. Finally, titanium or tantalum or both may be combined with one or more of the following elements: zirconium, hafnium, molybdenum, tungsten, chromium and tin.

In certain embodiments, the deposition may be performed using Physical Vapor Deposition (PVD), Atomic Layer Deposition (ALD), or Chemical Vapor Deposition (PVD) or a combination thereof. For example, PVD of the layer may be performed using one PVD sputtering target. In this example, materials forming the layer come from the PVD target and, in some cases, from precursor gases as well. These deposition methods may be used to deposit layers including materials described above.

In certain embodiments employing PVD, the apparatus includes a process chamber with one or more sputtering targets containing metals used to form the multi-element diffusion barrier, a wafer support, and a controller with program instructions. The instructions may correspond to operations as described above and including instructions for depositing an alloy or a mixture of metals. One or more sputtering targets may include material forming the layer as described above. In certain embodiments, only one PVD sputtering target is used. Such target may include multiple materials forming the barrier layer. For example, a PVD sputtering target may have a plurality of wedge or other shaped inlays. Each inlay includes one or more materials forming the barrier layer.

As in other aspects of the invention, the thickness of the layer may be between about 3 nm and 10 nm. Certain combinations of multiple component elements or other materials in a single layer provide sufficient diffusion blocking properties even at this thickness range. For certain compositions, the layer may be sufficiently conductive for direct electroplating. The sheet resistance of some barrier layers may be no greater than about 50 Ohm per square. In certain embodiments, the sheet resistance may be between about 2 Ohm per square and 10 Ohm per square.

As in other aspects of the invention, the diffusion barrier layer may be deposited in a recessed feature less than about 65 nm wide. In certain embodiments, recessed features may be less than about 40 nm wide. Such features are found in metallization layers. In alternative embodiments, the diffusion layer may be used for 3-D packaging interconnections.

These and other features and advantages of the invention will be described in more detail below with reference to the associated drawings.

DETAILED DESCRIPTION OF A PREFERRED EMBODIMENT

In the following description, numerous details are set forth in order to provide a thorough understanding of the present invention. The present invention may be practiced without some or all of these details. In other instances, well known process operations have not been described in detail to not unnecessarily obscure the present invention. While the invention will be described in conjunction with the specific embodiments, it will be understood that it is not intended to limit the invention to the embodiments. References herein to physical vapor deposition, chemical vapor deposition, and atomic layer deposition are intended to cover many variants of these processes, including processes that are assisted with plasma, vacuum or low pressure processes, atmospheric pressure processes, etc.

Introduction

Improved methods and apparatuses for deposition and further processing of diffusion barriers are disclosed herein. Integrated circuit (IC) metallization layers including diffusion barrier layers are also described. The following description focuses on IC lines electroplated with copper, however it should be understood that aspects of this invention are also applicable to IC lines made of aluminum, titanium, silver, tantalum, tungsten, molybdenum, or any other conductive material compatible with IC fabrication.

Figure 1A:
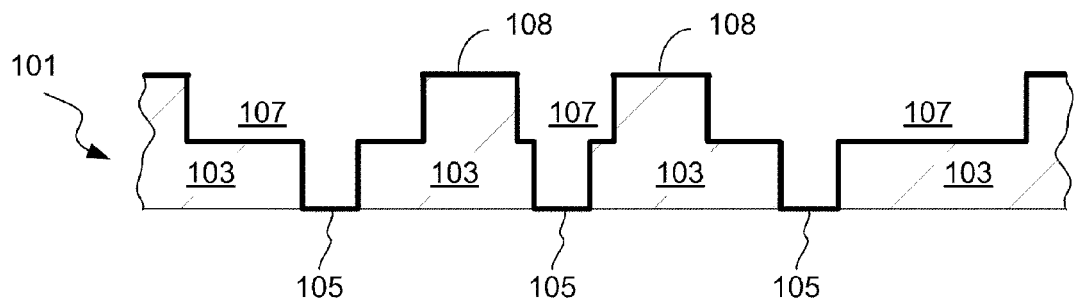
FIGS. 1A-D show cross sectional depictions of illustrative device structures created during a copper dual Damascene fabrication process in accordance with one embodiment.

In order to frame the context of this invention, a brief description of a copper dual Damascene process is provided. FIG. 1A illustrates of a typical substrate 101, which may reside on a layer carrying active devices, such as transistors, or on an underlying metallization layer containing copper lines or other type of metallization. The substrate 101 includes a pre-formed dielectric layer 103, such as a fluorine or carbon doped silicon dioxide or organic-containing low-k material, with etched recessed features 107, i.e. trenches and vias defining line paths, and a field region 108. A thin diffusion barrier layer 105 is deposited conformally to coat the substrate surface both within the recesses and on the field. The diffusion barrier layer 105 protects the dielectric layer 103 and underlying active devices from diffusion of copper or other conductive metals. Conventional diffusion barrier materials may include tantalum, tantalum nitride, titanium nitride, and titanium tungsten. In the context of this invention, the diffusion barrier materials have unique compositions and/or morphologies. In a typical process, the barrier layer 105 is formed using physical vapor deposition (PVD), atomic layer deposition (ALD), or chemical vapor deposition (CVD).

Many diffusion barrier materials are chemically reactive with materials present in the ambient atmosphere, including oxygen, nitrogen and water. The oxides, nitrides, and other compounds formed when exposed to ambient conditions or when immersed into a water-based electrolyte are tend to be highly electronically resistive and resistant to electroreduction. Therefore, for this and other reasons, direct electrodeposition of elements which would be otherwise water electroreducible (such as copper, cobalt, nickel, iron, etc.) onto barrier materials typically do not nucleate uniformly, adhere poorly, and have a number of other electroplating issues. An intermediate seed layer (e.g. composed of copper when plating copper) is often required to improve the nucleation process and protect the diffusion layer from atmospheric or electrolyte chemical oxidation. However, each additional layer adds to the cost of the device and reduces the size of the trench available for, making the feature filling process more difficult. Typically, a copper seed layer is deposited using a PVD method over the entire barrier layer 105. The substrate 101 is then transferred from a PVD apparatus where the seed layer was deposited to an electroplating apparatus. During the transfer, the substrate 101 is typically exposed to the atmosphere. Any exposed layer, such as a seed layer, must therefore be sufficiently resistant to oxidation in the ambient or its oxides must be easily removable during the electroplating operation.

Figure 1B:
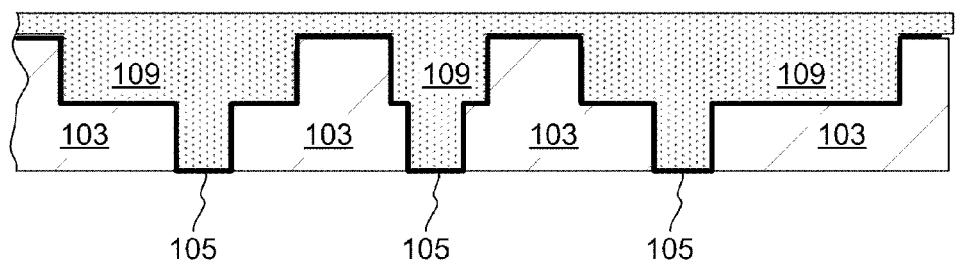
Figure 1C:
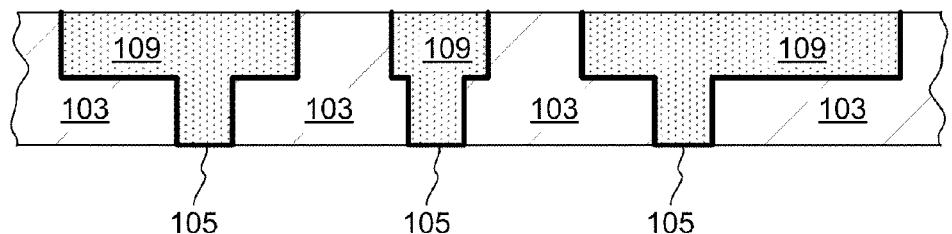

FIG. 1B illustrates filling the recessed features 107 with a conductive metal 109 to the point of covering the entire top surface of the substrate 101. Once the conductive layer 109 has been formed, it may be annealed by exposing the substrate to high temperature in order to improve the microstructure of deposited material. The deposits formed on the surfaces of the substrate are then removed to electrically isolate the embedded feature by a process (typically chemical-mechanical polishing) leading to the structure shown in FIG. 1C.

Figure 1D:
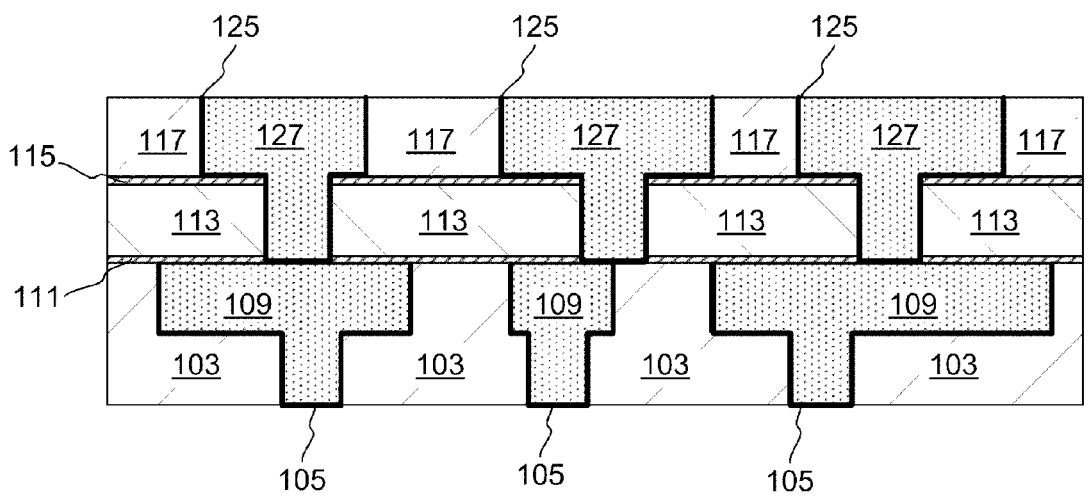

The process may follow by producing another metallization layer in a similar fashion. As depicted in FIG. 1D, a silicon nitride or silicon carbide etch stop layer 111 is deposited to encapsulate conductive routes 109 followed by deposition of another dielectric layer 113, which may be similar to the layer 103, and another etch stop layer 115. Once the recessed features are etched in the new metallization layer, a diffusion barrier layer and then a conductive seed layer (both shown as 125) are deposited, and the features are electroplated with the conductive metal 127. Conductive routes 127 and 109 are in electrical contact and form conductive pathways, but they are separated by the diffusion barrier 125. Therefore, it is desirable that the diffusion barrier layer be conductive. Additionally, some conductive routes of one layer may not be completely aligned with conductive routes of another layer forming an "un-landed via." For example, FIG. 1D shows that the middle recess feature 127 of the top layer forms only a partial contact with the corresponding feature in the bottom layer. Such un-landed via interfaces can present particular challenges and requirements in forming the diffusion barrier layer.

Barrier Layer Deposition Process (PVD)

In typical embodiments, the barrier layer is formed using a physical vapor deposition (PVD) method described below. However, it should be readily understood that the present invention may also be practiced using atomic layer deposition (ALD), chemical vapor deposition (CVD), wet chemistry (e.g. electroless deposition), and other deposition methods. A diffusion barrier layer may also be deposited using a combination of two or more methods.

Figure 2:
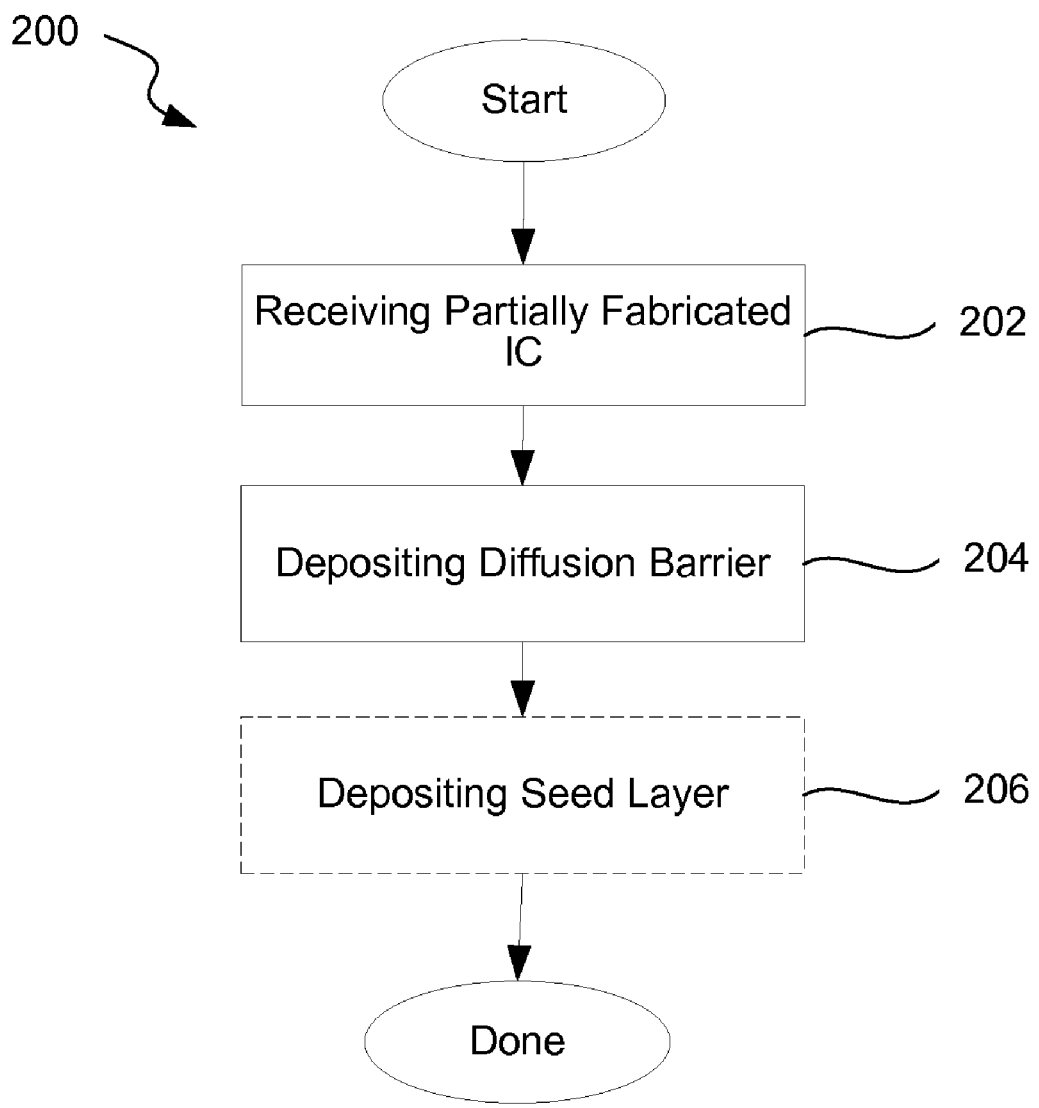
FIG. 2 illustrates a flowchart of depositing a copper-containing diffusion layer using a PVD process in accordance with one embodiment.

FIG. 2 is a general flow chart of a deposition process 200. A partially fabricated IC device is first received into a process chamber (block 202). The device may be a wafer with trenches and/or vias formed on its front surface. The trenches may be formed in a dielectric layer for supporting a metallization layer as described above. Alternatively, the wafer may have a flat surface, such as the top surface of a metallization layer, onto which a barrier layer is deposited. In certain embodiments, the partially fabricated IC device may include one or more (3D) stacks to be interconnected with through silicon vias or perform three-dimensional (3-D) packaging methods. A wafer pedestal holds the wafer in position during material processing and also provides temperature control of the wafer.

In one embodiment, the process chamber is a PVD chamber having a metal target containing a material that forms at least one component of barrier layer. During deposition, material from the target is sputtered or otherwise removed from the target in the form of ions or small neutral species (e.g., atoms). In a specific embodiment, the metal target is coupled to a voltage source that applies, for example, a negative DC bias. The PVD chamber may also include one or more magnets for confining the plasma in the proximity of the target. The metal target may include all or just some of the materials to be deposited in the diffusion barrier layer. In some embodiments, one or more materials in the diffusion barrier is supplied via a precursor gas or added in a separate operation, such as wet chemical exposure. An RF bias can be optionally applied to the wafer. Additional description of the apparatus and the target is provided below in the context of FIGS. 6-7.

Returning to FIG. 2, the substrate is typically placed on a wafer pedestal in the PVD chamber. Thereafter, the deposition of the diffusion barrier is performed (block 204). An inert gas (e.g., argon) is introduced into the chamber and plasma is ignited by applying a DC power to the target. In certain embodiments, the resulting plasma is confined using a magnetic field in the proximity of the target. During deposition, the argon is positively ionized in the plasma to form $Ar^+$ ions, which impinge on a negatively charged target with a sufficient momentum to dislodge metal atoms from the target. The neutral metal atoms dislodged from the target can be further ionized in the plasma. The metal species including neutral and ionized metal atoms are being sputtered from the target onto the wafer and deposit on the wafer surface forming a diffusion barrier layer. Depending on the electronic conductivity of the diffusion barrier layer further described below and requirements of the specific requirement of the electroplating method, deposition of an additional conductive seed layer may be required (block 206). For example, a copper seed layer may be deposited using a PVD process.

Copper-Containing Diffusion Barrier

The main purpose of a diffusion barrier layer is to prevent atoms in conductive current carrying lines from penetrating into the dielectric material encasing the lines. As metal atoms from the current carrying lines occupy regions of the dielectric, its dielectric properties degrade (i.e., its conductivity and capacitance increase). In addition, a good diffusion barrier is inert to the adjacent materials, i.e., the dielectric and conductive metal, and has good adhesion to both. Including copper into a diffusion barrier film seems counterintuitive. However, it has been found that some copper-containing diffusion barriers provide sufficient protection against copper diffusion and at the same time provide sufficiently high conductivity for direct electroplating (i.e., electroplating without a seed layer). In the crystalline morphology, which is a typical morphology found in diffusion barrier layers, diffusion is based on the availability of point vacancies throughout the crystal lattice. While not wanting to be limited by any particular theory, it is believed that introducing copper into certain materials that are inherently resistant to the diffusion of copper therein can distort or otherwise create extremely diffusion resistant structures, which completely immobilize copper. For example, introduced copper may occupy some of point vacancies in the diffusion barrier material and, thus, reduce the sites available for diffusion of metallic copper, such as copper from IC lines.

In one embodiment of the present invention, the diffusion barrier includes copper atoms. Copper is typically introduced into the diffusion barrier layer during deposition of the layer. It may be evenly distributed throughout the layer (i.e., it has a uniform concentration in the barrier material) or it may be unevenly distributed in which case it will exhibit a graded composition. In many, although not all, embodiments, it directly contacts with the underlying dielectric. Alternatively, in certain embodiments in which the copper concentration varies throughout the layer, essentially no copper may be present at the interface with the dielectric. Copper's mobility within the diffusion barrier may be limited by various mechanisms such as covalent bonding, sequestering copper in a defined lattice structure, etc.

The thickness of the barrier layer is usually determined by the application. Generally, applications employing recessed features having relatively small openings (small trench or via widths) and/or high aspect ratio features require relatively thinner barrier layers. In this document, the barrier layer is sometimes characterized in terms of an average thickness over an entire substrate, including recessed features and surface or "field" regions. In other cases, for substrates having recessed features, the average thickness is defined over only the recessed features, but typically all recessed features. In such cases, the thickness of the layer on the flat part (field region) of the front surface is ignored. If the front surface does not have the recessed features then the thickness of the entire layer is averaged to provide the average thickness value. In one embodiment, the average thickness of the copper-containing diffusion barrier layer may be less than about 50 nm, more specifically less than about 25 nm, and even more specifically less than about 15 nm. In a more specific embodiment, the average thickness is between about 1 nm and 10 nm.

In addition to thickness, another relevant characteristic of a diffusion barrier is its sheet resistance. As with thickness discussed above, the sheet resistance of the layer deposited over the surface of a substrate is determined as an average value. In one approach, the sheet resistance of a wafer having recessed features is defined as average sheet resistance of the layer within the features only. Alternatively, if the layer is deposited over the flat surface of the wafer only and no recessed features are present, then the sheet resistance is the average resistance over the entire layer. In one embodiment, the sheet resistance of the diffusion barrier layer may be no greater than 50 Ohm per square. In a specific embodiment, the sheet resistance may be between about 2 Ohm per square and 10 Ohm per square. Generally, though not always, introducing copper into the diffusion barrier film increases conductivity of the film. In cases where the copper-containing diffusion barrier has an average sheet resistance of about 10 Ohm per square or lower and an average thickness (in the recessed regions only) of about 15 nm, conductive line metal such as copper can be deposited directly onto the diffusion barrier layer, without the need for a separately deposited non-barrier and electroplateable (e.g. copper) seed layer.

Another characteristic of a diffusion barrier is its diffusivity measure of materials from conductive lines into the dielectric. In certain embodiments, copper and/or aluminum are used in conductive lines. Typically, a diffusion barrier is required to sustain dielectric performance for it to pass the Time Dependent Dielectric Breakdown requirements under operation conditions. For example, 1 m long capacitors would be required to have less than 0.1% failure rate for a duration of 10 years in operation conditions.

A copper-containing diffusion barrier may be particularly attractive for use in integrated circuits having relatively thin and/or densely packed current carrying lines, e.g., lines having a minimum line width of about 200 nm or less. In many conventional designs, the diffusion barrier layer is about 3 to 50 nm thick, while a copper seed layer adds other 60-200 nm. Clearly this conventional technology is not suitable for ICs having line widths under 200 nm since there is little or no volume left to fill with copper.

In one embodiment, a copper-containing diffusion barrier layer may be deposited in a recessed feature having a width of no greater than about 65 nanometers. In a specific embodiment, the layer may be deposited in a feature that is about 40 nanometers wide or thinner. In certain embodiments, the copper-containing layer serves as both a seed layer and a diffusion barrier. In such cases, the copper-containing layer may have thickness that is substantially less than that of a combined diffusion barrier layer and a copper seed layer in a conventional design. As a result, the copper-containing diffusion barrier layer may be more suitable for such smaller node technologies. In addition to being useful in conventional metallization layers, the copper-containing diffusion barrier layers of this invention may also find application in certain components having larger structures, such as 3-D packaging interconnections. One specific application may be through-silicon-vias (TSV's) or through-hole-vias (THV's) having a diameter of about 5-100 μm and a depths of about 20-500 μm.

Various deposition processes, including those identified above, may be used to deposit a copper-containing diffusion barrier layer. In one embodiment, the layer is deposited using a Physical Vapor Deposition (PVD) method. In a specific embodiment, a single PVD sputtering target provides all the component atoms that make up the diffusion barrier layer. For example, the target may include copper and other materials forming the layer, such as selenium, tellurium, metals selected from groups IVB, VB, and/or VIB, and combinations thereof. Different materials in the target may form an alloy or homogenous mixture. In certain embodiments, the different materials are provided as separate and discrete portions of the target such as wedges or blocks of the target. In another embodiment, several distinct targets each containing one or more materials used in a diffusion barrier may be used. For example, one target provided in the one PVD deposition chamber may include copper, while another target provided in another PVD deposition chamber may include selenium and/or tellurium. In an alternative embodiment, an Atomic Layer Deposition (ALD) method is used to deposit the diffusion barrier layer. This method is particular useful where a very thin and conformal diffusion barrier layer is required, such as where the barrier layer thickness is on the order of about 20 nanometers or less. Additionally, a chemical vapor deposition (CVD) method may be used.

In one embodiment, the copper-containing diffusion barrier layer may also include selenium (Se) and/or tellurium (Te). In specific embodiments, the diffusion barrier includes one or more selenides and/or tellurides having a structure isoelectronic with a copper oxide (CuO and $Cu_2O$) and minor stoichiometric variants thereof. For example, a stoichiometric ratio of copper to selenium or tellurium (i.e. Cu:X, where X=Se or Te) may be between about 0.5 and 3. Selenium and tellurium form covalent compounds with copper: copper selenides and tellurides (i.e., $Cu_2Te$, $Cu_2Se$, CuTe, or CuSe). In certain embodiments, copper forms an alloy and/or eutectic with selenium and tellurium. In a specific embodiment, a copper and selenium and/or tellurium containing barrier layer is deposited over another layer that has only marginal copper diffusion blocking properties. For example a layer of titanium may be further deposited with the copper-containing diffusion barrier layer. At certain thicknesses, titanium is not capable by itself of blocking copper diffusion. The resulting stack of titanium and copper and tellurium/selenium containing diffusion barrier may have sufficient diffusion blocking properties, and be relatively inexpensive due to the relatively low costs of titanium. Titanium's resistance to electromigration may provide further beneficial performance for the composite diffusion barrier.

Tellurides and selenides of conductive metals, such as copper tellurides and copper selenides, are semiconductors, and their conductivity varies depending on the amount of illumination. For example, a ratio of the light to dark illumination conductivities for CdTe films are about 100-200. Similar performance may be expected for copper selenides and copper tellurides. In one embodiment, the diffusion barrier layer including copper tellurides and/or copper selenides is further electroplated in the presence of light of the appropriate wavelength to enable photogenerated charge carries and reduce the resistance of the layer. The illumination increases the conductivity to a level sufficiently for direct electroplating. In contrast, traditional barrier materials, such as tantalum, do not exhibit photoconductance.

Copper tellurides and copper selenides can be formed on exposed surfaces of dielectric materials by contacting these surfaces with a solution containing selenium and/or tellurium and another solution containing copper. For example, an exposed surfaces may be first immersed into a tellurium containing solution, and then into a copper sulfide solution. The mechanism of deposition from the aqueous solution may be described as a combination of displacement and adsorption.

Consistent with the above general discussion, a copper-containing diffusion barrier layer that includes selenium or tellurium may be deposited using PVD, ALD, or CVD. In a specific embodiment, the layer is formed using a PVD process and selenium and/or tellurium are introduced into the PVD chamber as selenium hydride and/or tellurium hydride, which are gases under conventional PVD process conditions. Alternatively, a PVD sputtering target containing selenium and/or tellurium may be used. In a specific embodiment, a single PVD target is used to deposit the entire diffusion barrier layer and includes copper, selenium and/or tellurium. The deposition may be performed at between about 100 mTorr to 100 Torr chamber pressure. Hydrogen selenide ($SeH_2$) and/or hydrogen telluride ($TeH_2$) may be introduced at between about 1 sccm and 1000 sccm flow rates. The wafer pedestal may be kept at between about 20° C. and 400° C.

In one embodiment, a copper-containing diffusion barrier layer may also include tantalum (Ta) and one or more other metals selected from the group IVB, VB, and VIB elements of the periodic table. Tantalum is known for its excellent resistance to copper diffusion. However, it provides relatively poor resistance to electromigration, has a low conductivity, and is relatively expensive. Thus, copper and other metals selected from the group IVB, VB, and VIB elements may be combined with tantalum in certain proportions to compensate for tantalum's deficiencies. For example, titanium provides better electromigration characteristics, while copper improves conductivity of the layer. In another embodiment, halfnium and/or zirconium may be used. An overall stoichiometry of the alloys or mixture combinations may be expressed as $Ta_xTi_yCu_z$, where X is between about 0.5 and 1, Y is between about 0 and 0.5, and Z is between about 0 and 0.5. In certain embodiments, zirconium and/or halfnium replace titanium at a concentration represented by Y in the above stoichiometric equation. In certain embodiments, the stoichiometric ratios of $Ta_xTi_yCu_z$ are governed by the following equation: Y+Z=1−X. In various PVD embodiments, the target composition is such that the desired film is deposited. Further, nitrogen may be added in certain embodiments.

Generally, tantalum and titanium nitride are good material choices for diffusion barriers because their poor copper solubility. When copper concentration exceeds solubility limits of an alloy, copper is forced out of the alloy phase. For example, the solubility limit of copper in tantalum is only about 0.009 atomic percent. If copper is introduced into the diffusion barrier layer above the solubility limits of the base materials, then thermodynamically the copper will be forced out. However, while thermodynamically the system will tend to segregate, in some embodiments, the process of diffusion of copper at low temperature will be so limited that a metastable phase is created, with the concentration of copper above about 0.009 atomic percent and with very good barrier properties. Higher copper concentration may be desirable on the surface of the layer that will be electroplated. However, mobile copper should be kept some distance away from the underlying dielectric. In certain embodiments, the barrier layer has a graded concentration of copper in titanium and/or tantalum, with the concentration of copper being greater than its solubility limit (in the titanium and/or tantalum base) at the metal/barrier interface but is less than its solubility limit at the barrier/dielectric interface.

Figure 3:
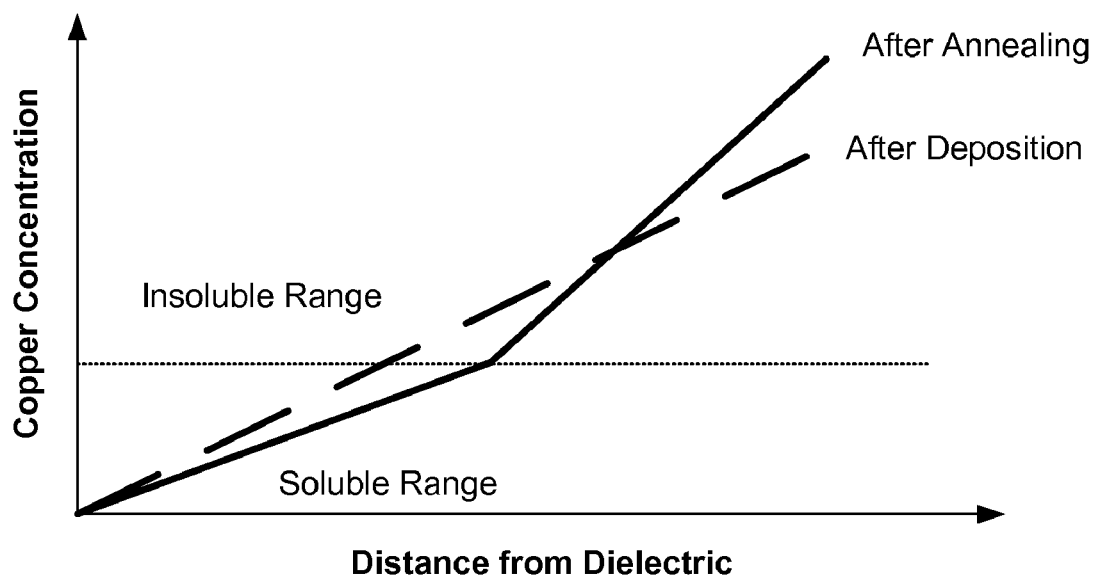
FIG. 3 is a plot illustrating one example of a copper concentration profile within a diffusion barrier layer.

In certain embodiments, the copper concentration throughout the diffusion barrier layer is maintained at a level where it does not substantially diffuse into dielectric material. For example, the concentration of copper may be within the solubility limit of the base alloy throughout the entirety of the diffusion barrier. Alternatively, as suggested, copper may be distributed within the diffusion barrier layer in such way that copper is beneath its solubility limit in the alloy at least at the interface within the dielectric as shown in FIG. 3. Barrier layers having such graded compositions may be produced by, for example, introducing only small amount of copper at the beginning of the deposition process and increasing the amount later in the process. The copper concentration may be increased gradually as shown in FIG. 3 or in a step-like fashion. Overall, copper concentration should be relatively low at the dielectric interface and relatively high at the exposed surface of the diffusion barrier layer to be electroplated in order to improve this surface conductivity and allow for direct electroplating and eliminating the need for a seed layer. In one embodiment, copper concentration at the exposed surface is at least about 75 atomic percent. In a specific embodiment, copper concentration at the surface is at least about 90 atomic percent.

In certain embodiments, a barrier layer coated with copper is processed after deposition to more evenly distribute the copper within and upon the diffusion barrier layer. For example, the barrier layer may be annealed after deposition. In other embodiments, an anneal or other post-deposition process may be employed to affect just the opposite result: forcing copper towards the exposed surface. In order to direct copper to the exposed surface and away from the dielectric interface, a thin sub-layer may be integrated into the overall diffusion barrier layer. For example, a layer of titanium and/or tantalum that does not include copper may be first deposited onto the dielectric followed by deposition of a copper-containing diffusion barrier.

Figure 4:
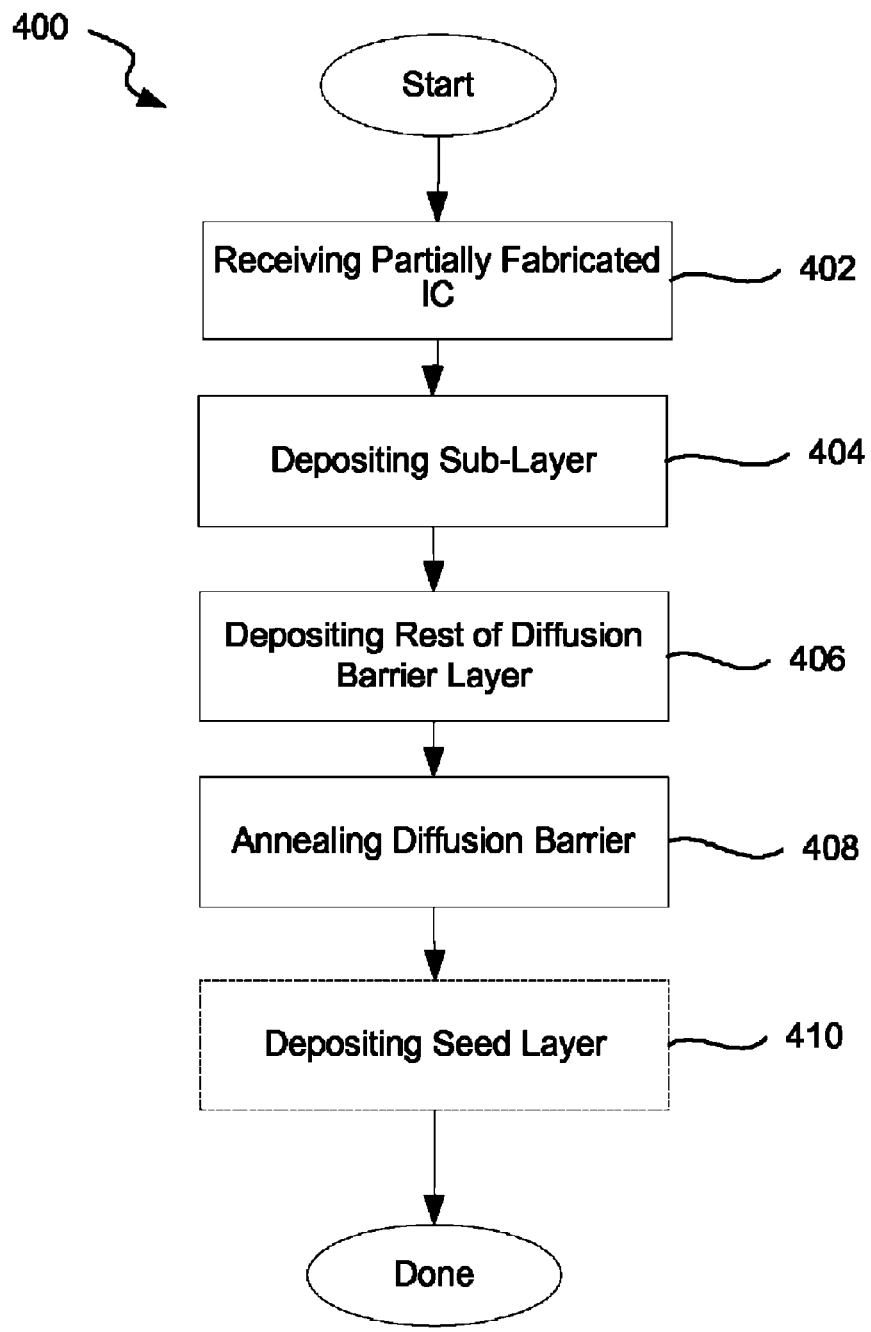
FIG. 4. illustrates a process flowchart of depositing a diffusion barrier layer in accordance with one embodiment.

FIG. 4 is a flowchart of a process to deposit a copper-containing diffusion barrier layer with a thin sub-layer and to anneal the layer after its deposition. The process starts with receiving a partially fabricated integrated circuit (block 402). Typically this operation is the same or similar to operation 202 illustrated in FIG. 2 and described above. A thin sub-layer is then deposited on the exposed surface of the dielectric (block 404). The sub-layer may include tantalum and one or more other metals selected from the group IVB, VB, and VIB elements of the periodic table. A small amount of copper may also be present in the sub-layer. For example, copper may be within soluble limits of the sub-layer. In a preferred embodiment, the sub-layer includes tantalum and/or tantalum nitride (TaN$_x$) and titanium and/or titanium nitride (TiN stoichiometric). The concentration of titanium may be between about 0 atomic percent and 100 atomic percent, in more specific embodiments between about 40 atomic percent and 100 atomic percent. Likewise, the concentration of tantalum may be between about 0 atomic percent and 100 atomic percent, in more specific embodiments between about 40 atomic percent and 100 atomic percent A PVD process may be used for depositing the sub-layer. Similarly, an ALD and/or a CVD method may be used. The film thickness may be between about 1-5 nm.

The process continues with depositing the remainder of the diffusion barrier layer (block 406). In a typical embodiment, the copper concentration is significantly higher in the remaining layer than in the sub-layer, since the sub-layer will prevent diffusion of copper into the dielectric. The concentration of copper may be between about 0 atomic percent and 10 atomic percent, in more specific embodiments between about 0 atomic percent and 1 atomic percent. A PVD, ALD, or CVD method may be used for depositing this sub-layer. In one embodiment, a continuous process may be used to deposit the entire layer including both sub-layers (blocks 404 and 406). In a specific embodiment, the concentration of copper is varied by sputtering different areas of the composite PVD target. For example, the plasma may be focused on different areas of the target by varying a magnetic field in the PVD chamber, with the different areas having different compositions. In the specific embodiment, a single PVD target is used to deposit the entire diffusion barrier layer. Additionally, flow-rates of precursor gases (typically organo-metallic compounds having metals used in the barrier layers) may be varied during the deposition to achieve different profiles of the deposited layer.

As indicated, copper may be redistributed within the layer after deposition. In one embodiment, the process includes annealing the diffusion barrier film (block 408). For example, annealing may be conducted at between about 150° C. and 400° C. and for a period of between about 0.1 minutes to 120 minutes. FIG. 3 shows examples of the copper concentration profile within the layer after deposition (but before annealing) and after annealing. A part of the layer facing away from the dielectric has copper above soluble range. The excess copper forms a separate metallic phase in the layer. However, the copper is blocked from diffusing into the dielectric by the sub-layer where copper remains within soluble limit.

Finally, in certain embodiments, the depicted method includes an optional deposition of a seed layer (block 406). Whether a seed layer is needed over the diffusion barrier layer depends on the resistance of the diffusion barrier layer and electroplating process requirements. Introduction of copper into the diffusion barrier layer may eliminate the need for a separate seed layer, and the diffusion barrier may be electroplated directly with a conductive metal that forms a circuit line.

Overall, the copper concentration in the diffusion barrier layer may be between about 0.1 and 10 atomic percent. Various concentration profiles can be used in such barrier films. It should be readily understood that any copper present on the interface with the dielectric should be trapped within the diffusion barrier layer by either being bound to the larger and more stable atoms, locked within the lattice, or have concentration that falls within the soluble limit of the alloy at that interface.

Controlled Passivation of the Diffusion Barrier

Elements from groups IVB, VB, and VIB (e.g., Ti, Zr, Hf, Rf, V, Nb, Ta, Ha, Cr, Mo, W) can spontaneously react with oxygen or water and form a thin non-conductive oxide layer. Many of these materials are good candidates for diffusion barriers because of their ability to strongly adhere with dielectric materials. As explained, some of these materials may be used in copper-containing diffusion barrier layers. In addition, some of these materials when deposited a very thin film within a feature (e.g. 150 nm or less) may be sufficiently conductive to allow direct electroplating. For example, tungsten has resistivity of 52.8 nΩm, which is significantly lower than that of tantalum. However, tungsten and other of the group IVB-VIB elements that are attractive candidates for barrier layers spontaneously react with oxygen when exposed to the ambient and form oxides that undesirably reduce conductivity of the surface. Oxides of some metals, such as chromium and titanium, may be subsequently removed (at least temporarily) with complex treatment steps, while many others for extremely rapidly or remain permanently bound to the surface.

In accordance with certain embodiments, diffusion barriers that include certain elements from groups IVB, VB, and VIB are treated to form a passivation layer before exposure to the atmosphere. Such passivation layer should be either easily removed before or during electroplating (e.g. electroreduced or react with components within the plating bath) or have sufficient conductivity for direct electroplating. In certain embodiments, a seed layer is deposited over the diffusion barrier layer to provide a surface of sufficient conductivity for electroplating.

As indicated, passivation of the diffusion barrier film should be performed before the diffusion barrier is exposed to the atmosphere. In one embodiment, a diffusion barrier may be formed in a PVD module of a processing system, which has several interconnected modules all operating in a single vacuum environment. The wafer with the deposited diffusion barrier may be then transferred to another processing module to form a passivation film layer. For example, another PVD module or a CVD module may be used to create the passivation layer. Alternative, the same module that was used to deposit the diffusion barrier may be also used to form a passivation layer. The module may include a single PVD combination target or multiple targets. In certain embodiments, the precursors used to form the passivation layer may be introduced to the PVD chamber, as process gases, after some or all of the deposited group IVB, VB, or VIB material is deposited.

In certain embodiments, passivation involves oxidizing the diffusion barrier layer (containing one or more elements from groups IVB, VB, and VIB) with sulfur (S), selenium (Se), and/or tellurium (Te) to form a sulfide, selenide, or telluride. Selection of one or another of these elements for passivation depends on the composition of the diffusion barrier layer and the desired properties of the passivation layer. Sulfides of the above mentioned materials are generally more stable than selenides or tellurides but may be harder to remove in subsequent operations. The conductivity of sulfides, selenides, and tellurides for the elements from groups IVB, VB, and VIB is greater than that of respective oxides making them more suitable for direct plating. In certain embodiments, hydrogen sulfide, hydrogen selenide, and/or hydrogen telluride are used for passivation the exposed surface of the barrier layer. Some selenides and tellurides are semi-metal compounds, for example, $ZrTe_3$ and $ZrTe_5$. Hafnium may be replaced with zirconium, and selenium may be replaced with tellurium with a minor effect on the resistivity.

Figure 5:
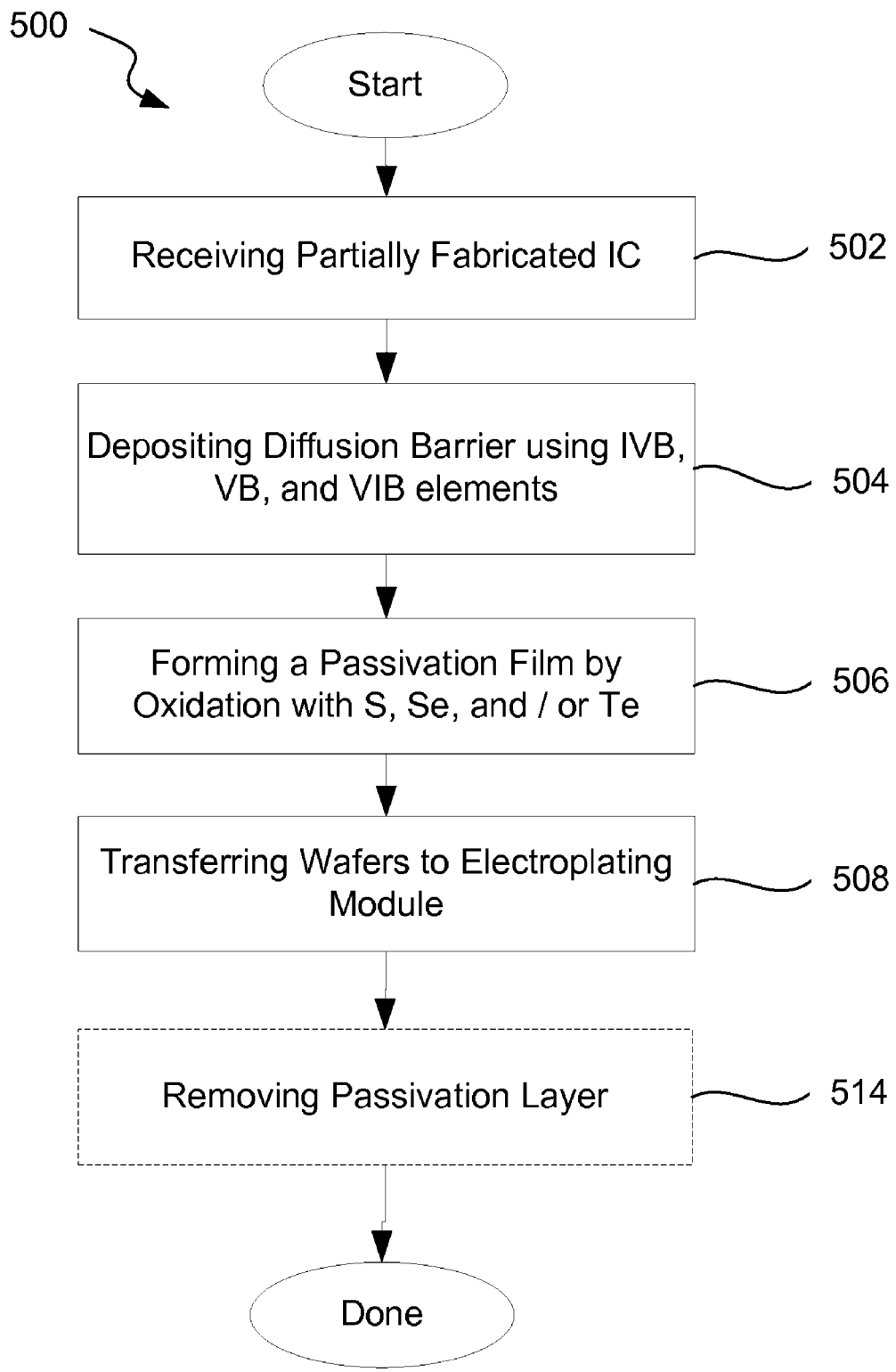
FIG. 5 illustrates a process flowchart of depositing and passivating a diffusion barrier layer in accordance with one embodiment.

FIG. 5 is a flowchart of the process including deposition and passivation of a diffusion barrier layer. The process starts with receiving a partially fabricated IC device (block 502). This operation may be similar in to operation 202 illustrated in FIG. 2 and described above. For example, a wafer with a partially fabricated IC devices may be placed into a PVD deposition chamber.

The layer of the group IVB, VB, or VIB element or elements is deposited (block 504). In one example, the deposited barrier material is tantalum, titanium, and zirconium and/or hafnium. In a further specific embodiment, the barrier material may also include copper. In a non-limiting example, the film is less than about 15 nm thick, and in a specific embodiment between about 3 and 10 nm thick. The metal layer usually represents the bulk of the final diffusion barrier layer. The deposition operation may employ a PVD, an ALD, or a CVD method. As indicated, a PVD method may employ a single PVD sputtering target that includes all materials deposited into the diffusion barrier film.

The process continues by converting the exposed surface of the metal layer to a layer of sulfide, selenide, and/or telluride to form the final diffusion barrier layer (block 506). In one embodiment, the wafer may be transferred to another processing module without being exposed to the ambient conditions. Alternatively, the operation may be performed in the module where the metal layer was deposited. Likewise, the same or different method may be used to form a passivation layer. For example, a PVD target containing selenium and/or tellurium may be sputtered in the same PVD deposition chamber where the metal layer was deposited. In this or other embodiment, the diffusion barrier layer is contacted with sulfur, selenium, and/or tellurium to form a surface layer of sulfide, selenide, and/or telluride.

The metal layer together with the passivation layer of sulfide, selenide, and/or telluride forms a final diffusion barrier layer that is then transferred to a different module for subsequent processing, such as electroplating. The layer is substantially inert to the ambient conditions containing oxygen. In some cases, the process does not involve deposition of an additional copper seed layer because the conductivity of the final diffusion barrier layer is sufficient for direct electroplating. However, in one embodiment, the diffusion barrier layer may be coated with a seed layer to further improve the conductivity. In this embodiment, the passivation layer allows for the partially fabricated ICs to be removed from the processing chambers and exposed to the ambient conditions before adding a seed layer. This may be the situation when, for example, the seed layer is deposited by electroless deposition or other wet process.

In certain embodiments, the passivation layer is removed in the electroplating module prior to plating conductive material (block 514). For example, the passivation layer may not be sufficiently conductive for direct electroplating and may therefore need to be removed prior to plating.

In a specific embodiment, tantalum is used as the diffusion barrier layer, and is reacted with selenium to form a tantalum selenide passivation layer (i.e., the layer has a $Ta/Ta_2Se_5$ structure). In another specific example, an alloy of tantalum and titanium serves as the barrier film, and includes a passivating selenide. ($Ti_xTa_y/Ti_xTa_ySe_{2x|5y}$). Alternatively, tellurium may be used to passivate the diffusion barrier layer ($TiTa/Ti_2Ta_2Te_9$). Zirconium is another possible choice for deposition of the barrier layer. Zirconium can be then be reacted with selenium ($Zr/ZrSe_n$) or tantalum ($Zr/ZrTa_m$). Zirconium may also be combined with tantalum to form a diffusion layer which is then oxidized with selenium ($Ta_xZr_y/Ta_xZr_ySe_z$) or tantalum ($Ta_xZr_y/Ta_xZr_yTa_z$). In the embodiments presented above, zirconium can be replaced with hafnium.

Diffusion Barrier Alloys

Conventional diffusion barrier layers often include only one base material, such as tantalum. Some of the tantalum may be converted into tantalum nitride. However, diffusion barrier layers using only one material have many limitations. For example, tantalum has resistivity of 131 n Ω·m, which is relatively high or and therefore present a challenge for direct electroplating. Furthermore, tantalum forms surface oxides that have tenacious nature and can be resistive to electrochemical reduction Therefore another layer, which is a more conductive layer such as a copper seed layer, must be deposited onto the tantalum diffusion barrier layer. This means that two separate PVD operations, each with its own PVD chamber, must be used thereby adding to the device cost. In addition, the two separate layers formed in stacked arrangement can significantly narrow the recess structures available for electroplating. Still further, tantalum easily oxidizes when exposed to oxygen, which presents some challenges in handling partially fabricated ICs. The oxide of tantalum is one of the most resistive metal oxides to electroreduction, and therefore direct electroplating onto an oxidized tantalum surface is exceedingly difficult. Many benefits may be achieved by combining several materials in a single layer.

In general, materials used for diffusion barrier layers may be grouped into three categories based on their properties. The first category includes materials that are impermeable to copper and provide strong diffusion barriers. Tantalum (Ta) is one of the most common and exemplary examples in this group. Materials in this category tend to have poor copper solubility, which also results in poor electromigration properties. The second category includes materials in which the surface energies of the barrier/copper interface promote good and complete coverage of copper over the barrier. Such materials also preferably have high electronic conductivity. The materials in this category include ruthenium (Ru), iron (Fe), manganese (Mn), cobalt (Co), nickel (Ni), palladium (Pd), gold (Au), silver (Ag), or platinum (Pt). Finally, the third category includes materials, such as titanium (Ti), manganese (Mn), Cobalt (Co), and aluminum (Al), that help to improve the electromigration resistance of Cu interconnects. Selecting only one material for a diffusion barrier layer often required sacrficing one desirable property to achieve other results. For example, materials with relatively low resistivity, e.g. ruthenium (71 n$\Omega$·m), cobalt (62.4 n$\Omega$·m), and nickel (69.3 n$\Omega$·m), are poor copper diffusion blockers. Titanium improves Cu electromigration resistance but forms alloys with copper and, thus, does not provide a hemetic seal for copper diffusion and hence is a poor copper diffusion blocker.

Combining two or more materials into one diffusion barrier layer may provide a single layer with multiple beneficial properties. In certain embodiments, tantalum is combined with titanium. As mentioned, tantalum has good diffusion barrier properties, while titanium is strongly resistant to electromigration. In certain proportions, a combination of tantalum and titanium provides a barrier material having good diffusion blocking and electromigration properties. In some barrier materials, aluminum is combined with tantalum or a combination of tantalum and titanium to further reduce electromigration.

A multi-metal diffusion barrier in accordance with this aspect of the invention may be deposited using PVD, ALD, or CVD. In one specific embodiment, a PVD method using a single PVD sputtering target is provided. The single target may employ an alloy of the multiple metals being deposited or discrete blocks or wedges of the individual metals. Alternatively, multiple PVD sputtering targets may be used in several PVD deposition chamber. For example, a tantalum target is provided in one PVD deposition chamber, while a titanium target is provided in another PVD deposition chamber.

In one embodiment, a diffusion barrier includes tantalum and titanium and/or nitrides of tantalum and titanium. Nitrides may be formed by flowing nitrogen into the deposition chamber during sputtering. In one embodiment, a diffusion barrier layer includes between about 0 atomic percent and 100 atomic percent tantalum and between about 0 atomic percent and 100 atomic percent titanium. In more specific embodiment, the concentration ranges of these components are as follows: between about 0 atomic percent and 90 atomic percent tantalum and between about 10 atomic percent and 100 atomic percent titanium. Some fraction of the tantalum and titanium may be converted to nitride. Concentration of titanium and tantalum and their respective nitrides may vary throughout the layer. In certain embodiments, concentration of tantalum is greater at the dielectric interface than on the conductive line interface, which is also referred to as "an exposed surface" in a partially fabricated device before deposition of a seed layer and/or a conductive line. Concentration of titanium may be greater at the conductive line interface than at the dielectric interface.

Titanium and tantalum may be distributed within the diffusion barrier layer in various ways. In one embodiment, both titanium and tantalum are evenly distributed throughout the layer Alternatively, the respective concentrations of these materials may vary gradually or abruptly. In the case of an abrupt concentration change, the barrier layer may include two or more sub-layers, each with a composition different from that of its neighboring sublayer(s). In some cases, one or more sublayer contains only a single metal (e.g., only titanium or only tantalum). In other embodiments, the concentrations of tantalum and/or titanium gradually change over the depth of the diffusion barrier. In one example, titanium which provides good copper interfacial coverage, growth nucleation, and improved electromigration resistance is provided at a relatively higher concentration on the interface with the copper line.

An experiment was conducted to compare electromigration properties of alloy barrier layers including tantalum and titanium to the same properties of tantalum-only barrier layers. Two sets of circuits were built with corresponding layers. The barrier layers were formed on recess feature structures. Then copper seed layers were deposited on the barrier layers and ultimately the seed layers were electroplated with copper. Finally, some circuits from each set were subjected to upstream current, and other circuits were subjected to downstream current electromigration tests. The test was performed with current density of amount 2.5 MA/cm$^2$ and at a temperature of about 325° C. The size of features used for the test was about 100 nm. The barrier layer thickness in the features was about 2 nm The results of the test are presented in Table 1 below and expressed as mean time to fail ($t_{50}$). The results indicate that addition of titanium significantly improves electromigration properties of the layer. In the worst case scenario, the electromigration properties are 90% better for the alloy barrier layer, indicating that a circuit built with such layer is likely to have significantly longer life.

TABLE 1

| Barrier Layer Type | TaN/Ta | TaN/Ta/Ti | Improvement |
|---|---|---|---|
| Upstream Current - $t_{50}$ | 31 +/− 0.73 hrs | 59 +/− 0.56 hrs | 90% |
| Downstream Current - $t_{50}$ | 45 +/− 0.28 hrs | 60 +/− 0.48 hrs | 33% |
| Worst Case | 31 +/− 0.73 hrs | 59 +/− 0.56 hrs | 90% |

In some cases, electromigration properties are improved by alloying a copper seed layer with some aluminum. However, this process results in additional costs and reduces seed's layer conductivity. It was surprisingly determined that electromigration characteristics can be substantially improved by introducing aluminum into the barrier layer during deposition with other materials. Aluminum generally improves conductivity of the barrier layer and provides good adhesion of the layer to the dielectric. In addition, aluminum can getter oxygen from the dielectric and form an aluminum oxide sublayer that promotes adhesion and, as a result, increases the Time Dependent Dielectric Breakdown (TDDB) lifetime.

In one embodiment, the barrier layer includes tantalum, titanium, ruthenium, cobalt, and nickel. Tantalum provides good copper diffusion properties, while titanium helps to improve electromigration. Ruthenium, cobalt, and nickel have low resistivities, 71 nΩ·m, 62.4 nΩ·m, and 69.3 nΩ·m respectively, which in some embodiments, may be sufficient to provide a directly electroplateable layer. In the same or other embodiments, barrier layers are annealed to stimulate redistribution of ruthenium, cobalt, and nickel to the interface with the copper line.

In another embodiment, a barrier layer includes manganese. Manganese can be combined with tantalum and/or and titanium. In certain embodiments, manganese may be deposited together with other materials using PVD. A concentration of manganese within the layer may vary. For example, relatively more manganese may be deposited on the silicon interface where diffusion blocking properties of manganese are more important. As a result of adding manganese, the thickness of the diffusion barrier stack may be reduced to less than about 20 nm (in feature). In certain embodiments, a layer with tantalum and titanium may also include zirconium (Zr), hafnium (Hf), molybdenum (Mo), tungsten (W), cobalt (Co), chromium (Cr) and tin (Sn).

Apparatus

As mentioned, certain embodiment described herein pertain to deposition of new diffusion barriers using physical vapor deposition. A number of PVD process chambers can be used for depositing diffusion barriers in accordance with these embodiments. For example, PVD process chambers that include a hollow cathode magnetron (HCM) or a planar magnetron can be used. The deposition operations are typically conducted in a PVD process chamber equipped with a metal target and/or RF-powered coil. Other deposition processes may also be used for specific embodiments and are discussed in the corresponding sections.

Figure 6:
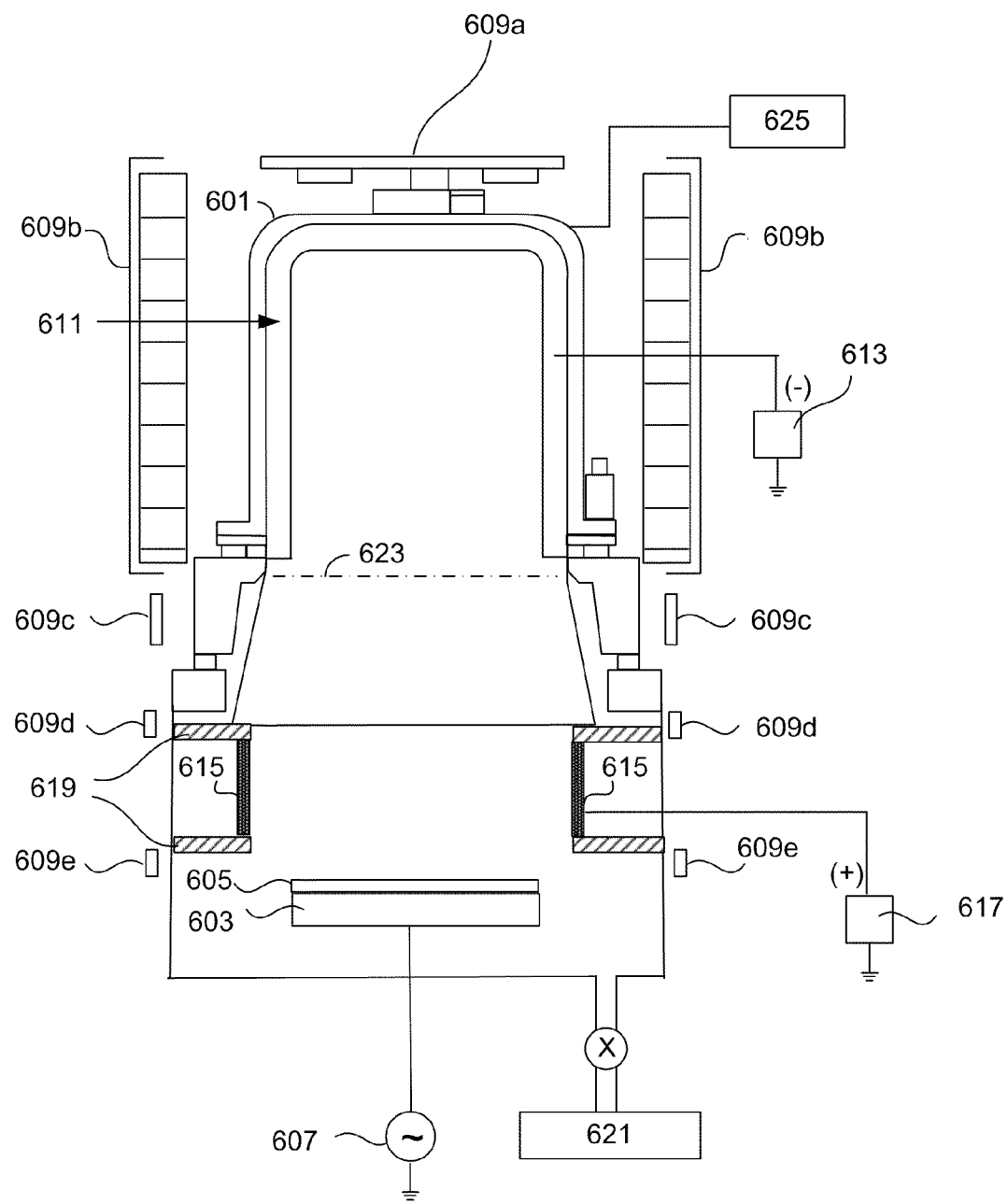
FIG. 6 is a cross sectional depiction of the hollow cathode magnetron (HCM) apparatus suitable for practicing methods described herein in accordance with one embodiment.

FIG. 6 illustrates a cross sectional view of one type of an HCM sputtering apparatus in accordance with one embodiment. The HCM apparatus has two main components: (1) the source 601, in which plasma is created and maintained, and (2) the RF bias electrostatic chuck (ESC) pedestal 603, which secures the wafer 605 and applies a negative RF bias to the wafer if needed. A separate RF power supply 607 is electrically connected to the wafer pedestal 603 to provides the RF bias when required. This provides a negative DC bias at the wafer 605 upon interaction of the biased wafer with the plasma. In some embodiments, deposition is performed without applying an RF bias to the wafer 605. The ESC pedestal 603 also serves to provide the temperature control for the wafer 605. The temperature at the wafer pedestal can range from about −50 to 400° C., preferably between about 0 and 150° C.

In this example, the HCM contains a top rotating magnet 609a, several annular side electromagnets 609b-609e, circumferentially positioned around the process chamber, and a sputter target 611 operated at a negative DC bias. The sputter target is electrically connected to the DC target power supply 613. A DC bias power of between about 1-100 kW is typically applied to the target 611. The density of plasma in the apparatus can be controlled by controlling magnetic confinement of plasma within the hollow target portion of the HCM and in the vicinity of the wafer. In some embodiments, highly magnetically confined plasma is generated within an HCM by applying an intense magnetic field at the target portion of an apparatus.

One or several shields may be positioned within the chamber next to the chamber sidewalls, to protect the sidewalls from the sputtered material. In the provided configuration, the shield 615 is positively biased and serves as an "ion extractor", configured to increase plasma density in the proximity of the wafer 605 by transferring ions from a high plasma density region to the wafer region. The ion extractor 615 is electrically connected to a separate DC power supply 617 and is configured to accept a positive bias from the power supply 817. A positive bias of at of at least about 30 V, preferably between about 50 and about 300 V, and even more preferably between about 100 V and about 150 V is applied to the ion extractor.

The ion extractor shield 615 is electrically isolated from the process chamber sidewalls with two insulating ceramic rings 619. In the provided example, the shield 615 is an aluminum member having a hollow cylindrical shape, which is located about 8 cm above the wafer pedestal 603, and about 16 cm below the target 611. Note, that since the ion extractor is positively biased during operation of an HCM, its material is not substantially sputtered onto the wafer surface. Therefore, the ion extractor can be made of a variety of conductive materials, which may be different from the material being deposited on the wafer.

The cathode target 611 generally has a hollow cup-like shape so that plasma formed in the source 601 can be concentrated within this hollow region. The cathode target 611 also serves as a sputter target and is, therefore, made of a metal material which is to be deposited onto a substrate. In certain embodiment, the target 611 includes multiple materials forming barrier layers. A target made of an alloy can be used to fill the features with alloys. In other embodiments, wedge or other shaped inlays to the bulk target may be used. Each of the inlays may include one or more materials. Plasma may be directed to various parts of the target 611 using variable magnetic field.

An inert gas, such as argon, is introduced through a gas inlet (not shown to preserve clarity) into the process chamber from the sides, just below the ion extractor 615. The pump 621 is positioned to evacuate or partially evacuate the process chamber. The control of pressure in the process chamber can be achieved by using a combination of gas flow rate adjustments and pumping speed adjustments, making use of, for example, a throttle valve or a baffle plate. Typically the pressure ranges between about 0.001 mTorr to about 100 mTorr.

An intense magnetic field is produced by electromagnets 609b within the cathode target region. The electrons emitted from the cathode are confined by the crossing electrical and magnetic fields within the hollow portion of the cathode target 611 to form a region of high plasma density within the hollow cathode. Additional electromagnets 609c-609e are arranged downstream of the cathode target and are used to shape and further confine the plasma at the elevations closer to the wafer pedestal 603.

In the described embodiment, the confinement of plasma in the region of high plasma density within the hollow target 611, is further increased by the presence of a separatrix 623. Separatrix 623 is an imaginary line associated with the distribution of the magnetic field lines within the chamber, which divides the magnetic field confining the plasma within the hollow target region from the magnetic field downstream in the proximity of the wafer. The separatrix 623 includes a region of null magnetic field residing between the target 611 and the wafer 605, which allows for transfer of ions from the region of plasma confined at the target to the proximity of the wafer. Typically, in an HCM, the separatrix 623 resides in the proximity of the target opening, but can be moved upward or downward in the chamber by the modulation of magnetic field polarity of individual magnets. The separatrix 623 can be formed by using magnetic fields of opposite polarities to confine the upper and lower regions of plasma. The separatrix 623 is desired for maintaining a high plasma density in the plasma region adjacent to the target, since it confines electrons and positively charged ions within this region. It is understood that in many embodiments the presence of a separatrix 623 may not be necessary.

In certain embodiments, a system controller 625 is employed to control process conditions during diffusion barrier layer deposition, passivation, insertion and removal of wafers, etc. The controller 625 may include one or more memory devices and one or more processors with a CPU or computer, analog and/or digital input/output connections, stepper motor controller boards, etc.

In certain embodiments, the controller 625 controls all of the activities of the deposition apparatus. The system controller 625 executes system control software including sets of instructions for controlling timing, gas flows, chamber pressure, chamber temperature, wafer temperature, RF power levels at the wafer, DC power levels at the target, polarity of electromagnetic coils 609a-e, power levels and current levels applied to the coils 609a-e, power levels and a bias, applied to the ion extractor 615, wafer chuck or susceptor position, and other parameters. Other computer programs and instruction stored on memory devices associated with the controller may be employed in some embodiments.

Typically there will be a user interface associated with controller 625. The user interface may include a display screen, graphical software displays of the apparatus and/or process conditions, and user input devices such as pointing devices, keyboards, touch screens, microphones, etc.

The computer program code for controlling deposition processes can be written in any conventional computer readable programming language: for example, assembly language, C, C++, Pascal, Fortran or others. Compiled object code or script is executed by the processor to perform the tasks identified in the program. Signals for monitoring the process may be provided by analog and/or digital input connections of the system controller. The signals for controlling the process are output on the analog and digital output connections of the deposition apparatus.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

A plasma control program may include code for setting RF power levels applied to the wafer chuck, DC power levels applied to the target, DC or RF power levels applied to the ion extractor, as well as polarity parameters and current levels applied to different electromagnetic coils in an apparatus. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in pedestal or chuck. Appropriately programmed feedback and control algorithms may be used with data from these sensors to maintain desired process conditions.

In one embodiment, the controller 625 includes instructions for depositing a copper-containing diffusion barrier in a partially fabricated integrated circuit. For example, the instructions can specify process parameters for receiving a partially fabricated integrated circuit having and depositing a diffusion barrier layer onto the dielectric.

Figure 7:
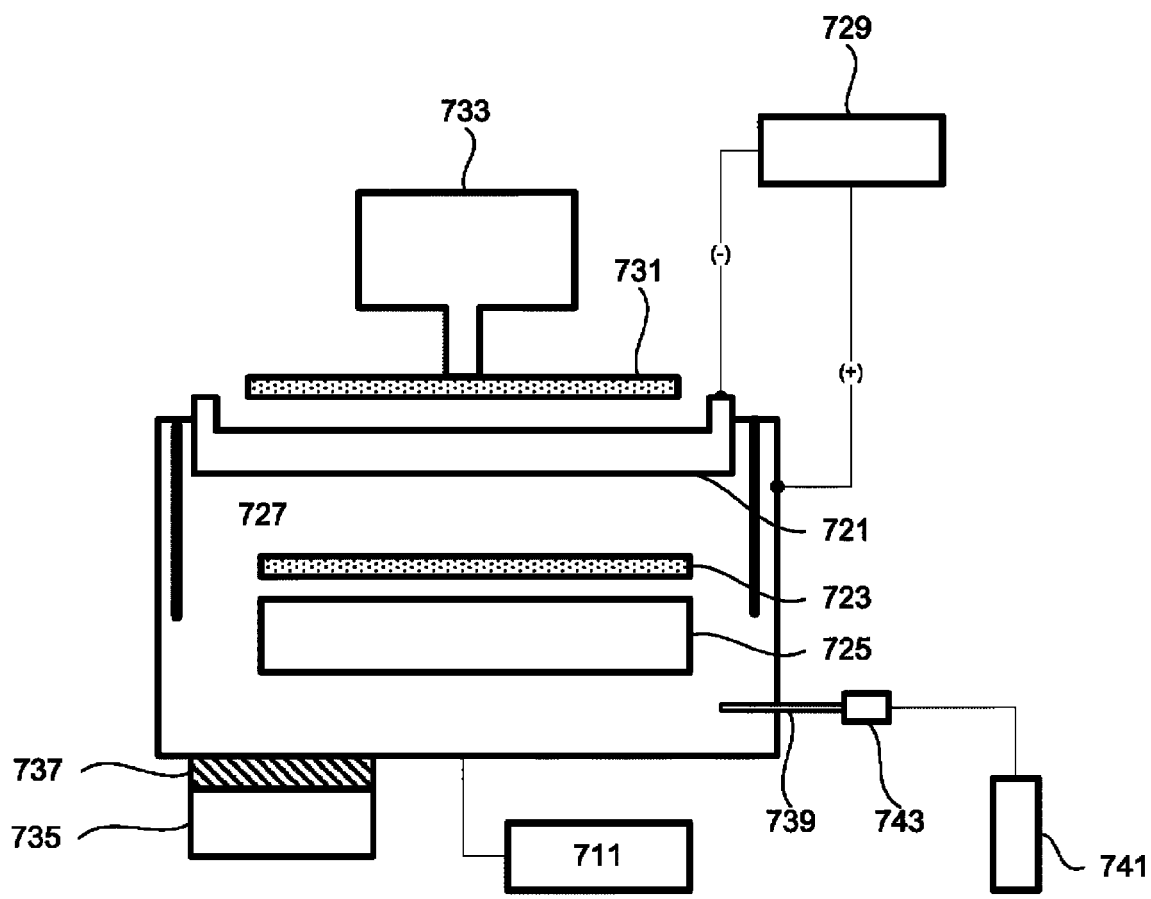
FIG. 7 is a cross sectional depiction of a planar magnetron apparatus suitable for practicing methods described herein in accordance with one embodiment.

According to other embodiments of the invention, the deposition can be performed using a planar magnetron. FIG. 7 shows a schematic representation of an example planar magnetron 720. Target 721, a circular, planar block of material to be deposited, is spaced from the wafer 723, which is mounted on a heating stage 725 in chamber 727. A DC power supply 729 is used to apply a DC field to target 721, establishing a plasma in the chamber below target 721. A circular magnet 731 mounted above the target is rotated by motor 733 setting up a magnetic field extending through target 721 into the region between the target 721 and the wafer 723. A cryopump 735 connected to chamber 727 via valve 737 is used to evacuate the chamber. Process gas injector 739 is connected to process gas supply 741 via mass flow controller 743. A sputtering gas is introduced into chamber 727 via injectors 739. A controller 711 can include program instructions for performing depositing diffusion barrier methods as was described above. It is understood that the structure of module 720 is exemplary only. The methods of present invention may be practiced in other types of planar magnetrons, such as ones having ICP sources. It is noted that the methods of present invention do not require the presence of an RF-biased coil within the apparatus, although they can be practiced in an apparatus equipped with such coil.

Figure 8:
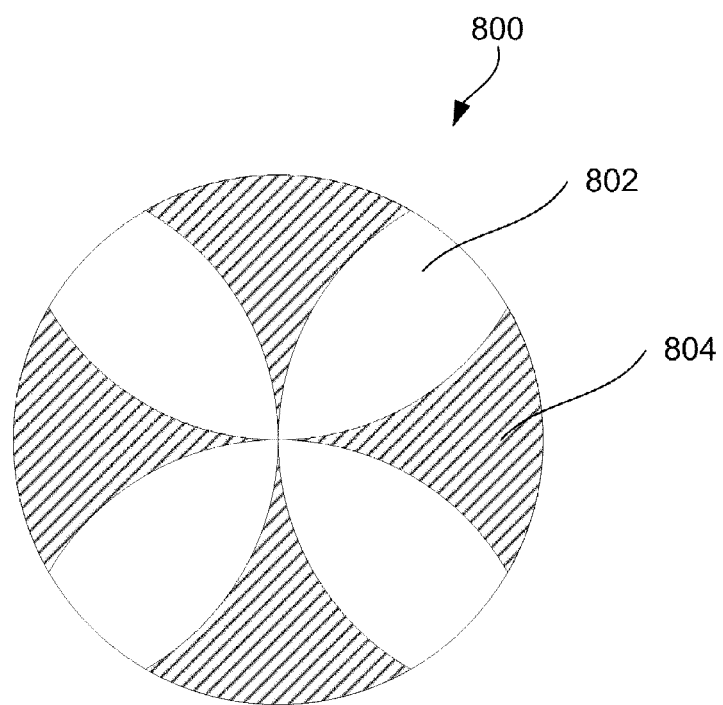
FIG. 8 illustrates bottom views of two PVD sputtering targets including wedges and inserts for depositing barrier layers with multiple materials.
Figure 8:
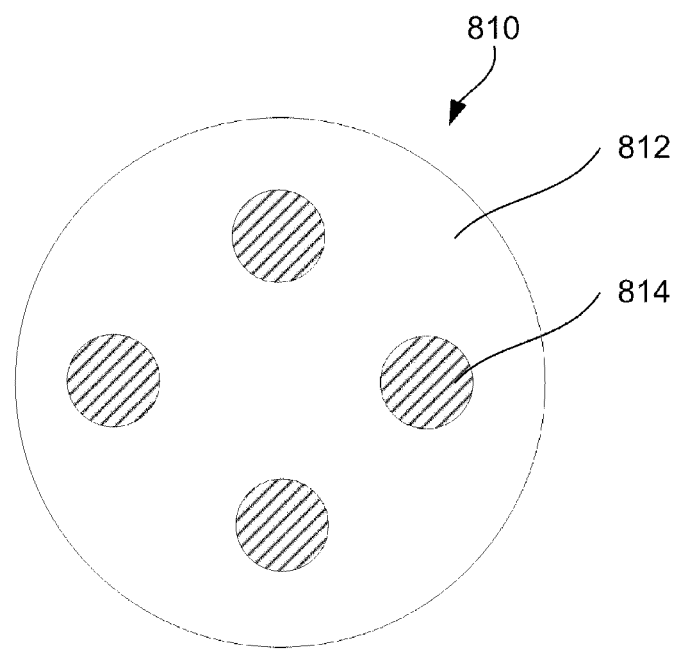

FIG. 8 illustrates bottom views of two PVD sputtering targets that include wedges and inserts for depositing barrier layers with multiple materials. These views correspond to both planar magnetron and hollow cathode magnetron configurations described above. A wedge-type target 800 has a base 802 and one or more wedges 804. The base 802 may include one material, which may be an element from the periodic table or a combination of several elements, e.g. alloy, mixture, etc. The wedge 804 may also include one materials, which likewise may be one element or a combination. In certain embodiments, the exposed surfaces of the base 802 and the wedges 804 may be representative of the barrier layer composition. The plasma may be directed to certain exposed areas of the target to achieve variable composition of the deposited barrier layer. Plasma may be first focused to the base 802 at the beginning of the deposition process and then refocused to one or more of the wedges 804, or vice versa. It should be understood that wedges may have any suitable shapes and dimensions configured to achieve desired composition of the barrier layer. For example, a target 810 may include inserts 814 that are positioned within the base 812.

CONCLUSION

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

All references cited herein are incorporated by reference for all purposes.

What is claimed is:

1. A method of depositing a copper-containing diffusion barrier layer in a partially fabricated integrated circuit for blocking diffusion of copper into a dielectric material, the method comprising:
   (a) receiving the partially fabricated integrated circuit comprising the dielectric material having an exposed surface; and
   (b) depositing the copper-containing diffusion barrier layer comprising copper and one or more other elements on and in contact with the exposed surface of the dielectric material,
      wherein copper is introduced into the copper-containing diffusion barrier layer during or after introducing the one or more other elements into the copper-containing diffusion barrier layer, and
      wherein the copper-containing diffusion barrier layer substantially prevents copper from diffusing into the dielectric material during operation of the integrated circuit.

2. The method of claim 1, wherein depositing the copper-containing diffusion barrier is performed using a deposition process selected from the group consisting of Physical Vapor Deposition (PVD), Atomic Layer Deposition (ALD), and Chemical Vapor Deposition (CVD).

3. The method of claim 1, wherein the copper-containing diffusion barrier layer has an average thickness of no greater than about 15 nanometers.

4. The method of claim 1, wherein the copper-containing diffusion barrier layer is sufficiently conductive to allow uniform electroplating over the copper-containing diffusion barrier layer without forming any additional conductive layers over the diffusion barrier layer.

5. The method of claim 1, wherein the copper-containing diffusion barrier layer has a sheet resistance of no greater than about 50 Ohm per square.

6. The method of claim 1, wherein the partially fabricated integrated circuit comprises a recessed feature in the dielectric material having a width of no greater than about 65 nanometers, and wherein the copper-containing diffusion barrier layer is deposited on and in contact with an exposed surface of the recessed feature.

7. The method of claim 1, wherein the partially fabricated integrated circuit comprises a 3-D packaging interconnection via through the dielectric material and wherein the copper-containing diffusion barrier layer is deposited on and in contact with an exposed surface of the interconnection via.

8. The method of claim 1, wherein the copper-containing diffusion barrier layer comprises selenium and/or tellurium.

9. The method of claim 1, wherein the copper-containing diffusion barrier layer comprises tantalum and one or more other metals selected from the group IVB, VB, and VIB materials of the periodic table.

10. The method of claim 1, further comprising electroplating conductive metal on and in the contact with the copper-containing diffusion barrier layer.

11. The method of claim 2, wherein depositing the copper-containing diffusion barrier is performed using the PVD process employing a single PVD sputtering target.

12. The method of claim 8, wherein the copper-containing diffusion barrier layer comprises $Cu_2Te$, $Cu_2Se$, CuTe, and/or CuSe.

13. The method of claim 8, wherein depositing the copper-containing diffusion barrier layer comprises:
   (a) immersing the exposed surface of the dielectric material into a solution comprising selenium ions and/or tellurium ions; and
   (b) immersing the exposed surface of the dielectric material into a solution comprising copper sulfate.

14. The method of claim 8, wherein depositing the copper-containing diffusion barrier layer comprises:
   (a) sputtering copper on the exposed surface of the dielectric material using a Physical Vapor Deposition (PVD) process; and
   (b) introducing selenium hydride and/or tellurium hydride into a PVD chamber during the sputtering.

15. The method of claim 9, wherein a copper concentration of the copper-containing diffusion barrier layer is such that copper does not substantially diffuse into the dielectric material during fabrication and use of the integrated circuit.

16. The method of claim 9, wherein a copper concentration of the copper-containing diffusion barrier layer varies throughout a thickness of the copper-containing diffusion barrier layer.

17. The method of claim 9, further comprising annealing the copper-containing diffusion barrier layer.

18. The method of claim 9, wherein the copper-containing diffusion barrier layer comprises at least one material selected from the group consisting of titanium, hathium, and zirconium.

19. The method of claim 17, wherein the annealing is performed at between about 150° C. and 400° C. for a period of between about 0.5 minutes and 120 minutes.

20. The method of claim 18, wherein the copper concentration in the copper-containing diffusion barrier layer is between about 0.1 atomic percent and about 10 atomic percent.

21. The method of claim 10, wherein the copper-containing diffusion barrier layer is illuminated during electroplating to reduce resistivity of the copper-containing diffusion barrier layer.

22. A Physical Vapor Deposition (PVD) apparatus for depositing a copper-containing diffusion barrier layer in a partially fabricated integrated circuit on a wafer for blocking diffusion of copper into a dielectric material, the apparatus comprising:
   (a) a process chamber, said process chamber configured to perform PVD;
   (b) a PVD sputtering target comprising copper positioned inside the process chamber;
   (c) a wafer support for holding the wafer in position during depositing the copper-containing diffusion barrier layer, wherein the wafer support is positioned inside the process chamber; and
   (d) a controller comprising program instructions for:
      (i) receiving the partially fabricated integrated circuit having the dielectric material with an exposed surface; and
      (ii) depositing the copper-containing diffusion barrier layer comprising copper and one or more other elements on and in contact with the exposed surface of the dielectric material,
         wherein copper is introduced into the copper-containing diffusion barrier layer during or after introducing the one or more other elements into the copper-containing diffusion barrier layer, and wherein the copper-containing diffusion barrier layer substantially prevents copper from diffusing into the dielectric material during operation of the integrated circuit.

23. An integrated circuit metallization layer comprising:
(a) a dielectric layer having a surface;
(b) a copper-containing diffusion barrier layer comprising copper and selenium and/or tellurium, the copper-containing diffusion barrier layer positioned on and in contact with the surface of the dielectric layer,
wherein the copper-containing diffusion barrier layer substantially prevents copper from diffusing into the dielectric layer during operation of the integrated circuit and the copper-containing diffusion barrier layer reduces its resistivity when illuminated during electroplating of the circuit line; and
(c) a circuit line positioned on and in contact with the copper-containing diffusion barrier layer.

24. A PVD apparatus for depositing a combined seed and diffusion barrier layer in a partially fabricated integrated circuit for blocking diffusion of a conductive metal forming a circuit line to a dielectric material and for providing a conductive surface onto which a circuit line can be electroplated, the apparatus comprising:
(a) a process chamber, said process chamber configured for PVD;
(b) a PVD sputtering target positioned inside the process chamber;
(c) a wafer support positioned inside the process chamber, wherein the wafer support is configured for holding the wafer in position during depositing the combined seed and diffusion barrier layer; and
(d) a controller comprising program instructions for:
 (i) receiving the partially fabricated integrated circuit comprising the dielectric material having an exposed surface;
 (ii) depositing a metal layer on the exposed surface of the dielectric layer, wherein the metal layer comprises a metal selected from the group IVB, VB, and VIB materials in the periodic table; and
 (iii) converting an exposed metal surface of the metal layer to a layer of sulfide, selenide, and/or telluride of the metal to thereby protecting the metal layer from forming an oxide.

* * * * *